US012677462B2

(12) United States Patent
  Bao et al.

(10) Patent No.:   US 12,677,462 B2
(45) Date of Patent:        Jul. 7, 2026

(54) INTEGRATING STANDARD-GATE TRANSISTORS AND EXTENDED-GATE TRANSISTORS ON THE SAME SUBSTRATE USING LOW-TEMPERATURE GATE DIELECTRIC TREATMENTS

(71) Applicant: International Business Machines Corporation, Armonk, NY (US)

(72) Inventors: Ruqiang Bao, Niskayuna, NY (US); Junli Wang, Slingerlands, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 783 days.

(21) Appl. No.: 17/512,784

(22) Filed: Oct. 28, 2021

(65) Prior Publication Data

US 2023/0133296 A1      May 4, 2023

(51) Int. Cl.
  H10D 64/01          (2025.01)
  H10D 30/01          (2025.01)
          (Continued)

(52) U.S. Cl.
  CPC ....... H10D 64/0134 (2026.01); H10D 30/024 (2025.01); H10D 30/031 (2025.01);
          (Continued)

(58) Field of Classification Search
  CPC ............. H01L 21/28185; H10D 64/01; H10D 62/118; H10D 64/514; H10D 30/67; H10D 84/856; H10D 84/834
  See application file for complete search history.

(56) References Cited

U.S. PATENT DOCUMENTS 9,224,826 B2    12/2015   Kwon et al.
9,935,014 B1     4/2018   Cheng et al.
          (Continued)

FOREIGN PATENT DOCUMENTS

CN        110690290 B      12/2020

OTHER PUBLICATIONS

International Search Report and Written Opinion; Mailed: Feb. 13, 2023; Application No. PCT/EP2022/079504; Filed: Oct. 24, 2022; 15 pages.

*Primary Examiner* — Christine A Enad
(74) *Attorney, Agent, or Firm* — CANTOR COLBURN LLP; L. Jeffrey Kelly

(57)          ABSTRACT

Embodiments of the invention are directed to a method of fabricating an integrated circuit (IC). The method includes performing fabrication operations to form an extended-gate field effect transistor (EG-FET) on a substrate. The fabrication operations include forming a channel in an EG region of the substrate. A first EG gate dielectric is deposited over the channel at a first low-temperature. A reinforcement treatment is applied to the first EG gate dielectric at a second low-temperature, wherein the reinforcement treatment converts the first EG gate dielectric to a reinforced first EG gate dielectric. The first low-temperature is selected to be below the second low-temperature; and the second low-temperature is selected to be below a third low-temperature that causes a diffusion of a first type of semiconductor material across an interface and into a second type of semiconductor to exceed a predetermined minimum diffusion level or rate.

17 Claims, 30 Drawing Sheets

(51) Int. Cl.

| | |
|---|---|
| *H10D 30/62* | (2025.01) |
| *H10D 30/67* | (2025.01) |
| *H10D 62/10* | (2025.01) |
| *H10D 64/27* | (2025.01) |
| *H10D 84/01* | (2026.01) |
| *H10D 84/03* | (2025.01) |
| *H10D 84/08* | (2025.01) |
| *H10D 84/83* | (2025.01) |
| *H10D 84/85* | (2025.01) |

(52) U.S. Cl.
CPC ......... *H10D 30/6211* (2025.01); *H10D 30/67* (2025.01); *H10D 30/6735* (2025.01); *H10D 62/118* (2025.01); *H10D 64/01* (2025.01); *H10D 64/01344* (2026.01); *H10D 64/017* (2025.01); *H10D 64/514* (2025.01); *H10D 84/0144* (2025.01); *H10D 84/0158* (2025.01); *H10D 84/0181* (2025.01); *H10D 84/0193* (2025.01); *H10D 84/038* (2025.01); *H10D 84/08* (2025.01); *H10D 84/834* (2025.01); *H10D 84/853* (2025.01); *H10D 84/856* (2025.01)

(56) References Cited

U.S. PATENT DOCUMENTS

| | | | | |
|---|---|---|---|---|
| 10,002,939 | B1 * | 6/2018 | Cheng | H10D 62/115 |
| 10,106,892 | B1 | 10/2018 | Siddiqui et al. | |
| 10,141,403 | B1 | 11/2018 | Cheng et al. | |
| 10,229,971 | B1 | 3/2019 | Cheng et al. | |
| 10,243,054 | B1 | 3/2019 | Cheng et al. | |
| 10,249,539 | B2 | 4/2019 | Juntao et al. | |
| 10,297,667 | B1 | 5/2019 | Yeung et al. | |
| 10,332,803 | B1 | 6/2019 | Xie et al. | |
| 10,396,169 | B2 | 8/2019 | Cheng et al. | |
| 10,504,735 | B2 | 12/2019 | Luan et al. | |
| 10,734,286 | B1 | 8/2020 | Ando et al. | |
| 10,741,449 | B2 | 8/2020 | Cheng et al. | |
| 2008/0001237 | A1 | 1/2008 | Chang et al. | |
| 2009/0039434 | A1 * | 2/2009 | Doris | H10D 64/691 |
| | | | | 257/E21.639 |
| 2009/0104743 | A1 * | 4/2009 | Alshareef | H10D 64/693 |
| | | | | 257/E21.247 |
| 2016/0027893 | A1 | 1/2016 | Kwon et al. | |
| 2019/0198629 | A1 | 6/2019 | Yeung et al. | |
| 2020/0105761 | A1 | 4/2020 | Liaw | |
| 2021/0036127 | A1 * | 2/2021 | Lin | H10D 64/017 |
| 2021/0098455 | A1 | 4/2021 | Yu et al. | |
| 2021/0225839 | A1 * | 7/2021 | Lin | H10D 84/834 |

* cited by examiner

Top-down reference view 101

Gate    Gate

NS          Fin

X    NS          Fin

Y1    Y2

Low-temp Reinforcement
Y1-view    Treatment    Y2-view
802    402    402

100

126
116
124
114
122
112

Reinforced Oxide
702A

702A
Reinforced Oxide

STI 502

STI 502

102

102

Substrate    Substrate

140    SG Region    EG Region    150

100

X-view    702A    X-view    702A 126
124    116
130    122    114
112

402

102

Substrate    Substrate    102

140    SG Region    EG Region    150

Top-down
reference view
101

Gate    Gate

NS    Fin

X    NS    Fin

Y1    Y2

100

Y1-view

Y2-view    Sacrificial
Oxide
1502

702A 126
124
122

402    402

HQ Thin
Oxide
1502

HQ Thin Oxide
1502
502    STI
102

STI    502
102

Substrate    Substrate

140    SG Region    EG Region    150

INTEGRATING STANDARD-GATE TRANSISTORS AND EXTENDED-GATE TRANSISTORS ON THE SAME SUBSTRATE USING LOW-TEMPERATURE GATE DIELECTRIC TREATMENTS

BACKGROUND

The present invention relates in general to semiconductor devices and their fabrication. More specifically, the present invention relates to fabrication processes and resulting structures for forming standard-gate transistors and extended-gate transistors on the same substrate using low-temperature (e.g., less than about 800 degrees Celsius) gate dielectric treatments to improve the dielectric quality of relatively thick extended-gate dielectrics.

Semiconductor devices are formed using active regions of a wafer. The active regions are defined by isolation regions used to separate and electrically isolate adjacent semiconductor devices. For example, in an IC wafer having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

In order to increase the maximum gate voltage that can be applied to a given transistor, so-called extended-gate (EG) transistors have been developed that include a larger volume of gate metal and/or a thicker gate dielectric than so-called standard-gate (SG) transistors.

SUMMARY

Embodiments of the invention are directed to a method of fabricating an integrated circuit (IC). The method includes performing fabrication operations to form an extended-gate field effect transistor (EG-FET) on a substrate. The fabrication operations include forming a channel in an EG region of the substrate. A first EG gate dielectric is deposited over the channel at a first low-temperature. A reinforcement treatment is applied to the first EG gate dielectric at a second low-temperature, wherein the reinforcement treatment converts the first EG gate dielectric to a reinforced first EG gate dielectric. The first low-temperature is selected to be below the second low-temperature; and the second low-temperature is selected to be below a third low-temperature. The third low-temperature is a temperature that causes a diffusion of a first type of semiconductor material across an interface and into a second type of semiconductor to exceed a predetermined minimum diffusion level or rate.

Embodiments of the invention are directed to a method of fabricating an IC. The method includes performing fabrication operations to form an EG-FET and a standard-gate field effect transistor (SG-FET) on the substrate. The fabrication operations include forming a stack in an SG region of the substrate, wherein the stack includes a layer of a first type of semiconductor material, a layer of a second type of semiconductor material, and an interface between the layer of the first type of semiconductor material and the layer of the second type of semiconductor material. An SG dielectric is deposited over the stack, wherein the SG dielectric includes an SG dielectric thickness. A channel is formed in an EG region of the substrate. A first EG gate dielectric is deposited over the channel at a first low-temperature. A reinforcement treatment is applied to the first EG gate dielectric at a second low-temperature, wherein the reinforcement treatment converts the first EG gate dielectric to a reinforced first EG gate dielectric having a reinforced first EG gate dielectric thickness. The first low-temperature is selected to be below the second low-temperature. The second low-temperature is selected to be below a third low-temperature that causes a diffusion of the first type of semiconductor material across the interface and into the second type of semiconductor such that the diffusion exceeds a predetermined minimum diffusion level. The SG dielectric is deposited over the reinforced first EG gate dielectric, wherein the SG dielectric includes an SG dielectric thickness, and wherein the SG dielectric thickness is less than the reinforced first EG gate dielectric thickness.

Embodiments of the invention are directed to an IC that includes an SG-FET on a substrate. The SG-FET includes an SG channel in an SG region of the substrate. An SG gate dielectric is over the SG channel, wherein the SG gate dielectric includes an SG gate dielectric thickness. An EG-FET is on the substrate. The EG-FET includes an EG channel in an EG region of the substrate, wherein the reinforced first EG dielectric includes reinforcement elements selected from the list consisting of a nitride, argon, helium, and hydrogen. A reinforced first EG gate dielectric is over the EG channel, wherein the reinforced first EG gate dielectric includes a reinforced first EG gate dielectric thickness. The SG dielectric is over the reinforced first EG gate dielectric. The SG dielectric thickness is less than the reinforced first EG gate thickness.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-18 depict cross-sectional views of portions of an integrated circuit (IC) after various fabrication operations to form SG transistor devices and EG transistor devices therein according to embodiments of the invention, in which:

FIG. 1 depicts cross-sectional views of the IC after initial fabrication operations for forming SG transistor devices and EG transistor devices on the same IC substrate according to embodiments of the invention;

FIG. 2 depicts cross-sectional views of the IC after initial fabrication operations for forming SG transistor devices and EG transistor devices on the same IC substrate according to embodiments of the invention;

FIG. 3 depicts cross-sectional views of the IC after fabrication operations for forming SG transistor devices and EG transistor devices on the same IC substrate according to embodiments of the invention;

FIG. 4 depicts cross-sectional views of the IC after fabrication operations for forming SG transistor devices and EG transistor devices on the same IC substrate according to embodiments of the invention;

FIG. 5 depicts cross-sectional views of the IC after fabrication operations for forming SG transistor devices and EG transistor devices on the same IC substrate according to embodiments of the invention;

FIG. 6 depicts cross-sectional views of the IC after fabrication operations for forming SG transistor devices and EG transistor devices on the same IC substrate according to embodiments of the invention;

FIG. 7 depicts cross-sectional views of the IC after fabrication operations for forming SG transistor devices and EG transistor devices on the same IC substrate according to embodiments of the invention;

FIG. 8 depicts cross-sectional views of the IC after fabrication operations for forming SG transistor devices and EG transistor devices on the same IC substrate according to embodiments of the invention;

FIG. 9 depicts cross-sectional views of the IC after fabrication operations for forming SG transistor devices and EG transistor devices on the same IC substrate according to embodiments of the invention;

FIG. 10 depicts cross-sectional views of the IC after fabrication operations for forming SG transistor devices and EG transistor devices on the same IC substrate according to embodiments of the invention;

FIG. 11 depicts cross-sectional views of the IC after fabrication operations for forming SG transistor devices and EG transistor devices on the same IC substrate according to embodiments of the invention;

FIG. 12 depicts cross-sectional views of the IC after fabrication operations for forming SG transistor devices and EG transistor devices on the same IC substrate according to embodiments of the invention;

FIG. 13 depicts cross-sectional views of the IC after fabrication operations for forming SG transistor devices and EG transistor devices on the same IC substrate according to embodiments of the invention;

FIG. 14 depicts cross-sectional views of the IC after fabrication operations for forming SG transistor devices and EG transistor devices on the same IC substrate according to embodiments of the invention;

FIG. 15 depicts cross-sectional views of the IC after fabrication operations for forming SG transistor devices and EG transistor devices on the same IC substrate according to embodiments of the invention;

FIG. 16 depicts cross-sectional views of the IC after fabrication operations for forming SG transistor devices and EG transistor devices on the same IC substrate according to embodiments of the invention;

FIG. 17 depicts cross-sectional views of the IC after fabrication operations for forming SG transistor devices and EG transistor devices on the same IC substrate according to embodiments of the invention; and FIG. 18 depicts cross-sectional views of the IC after fabrication operations for forming SG transistor devices and EG transistor devices on the same IC substrate according to embodiments of the invention.

DETAILED DESCRIPTION

Figure 1:
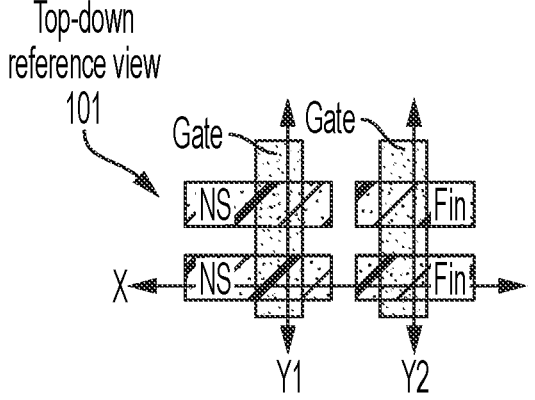
Figure 1:
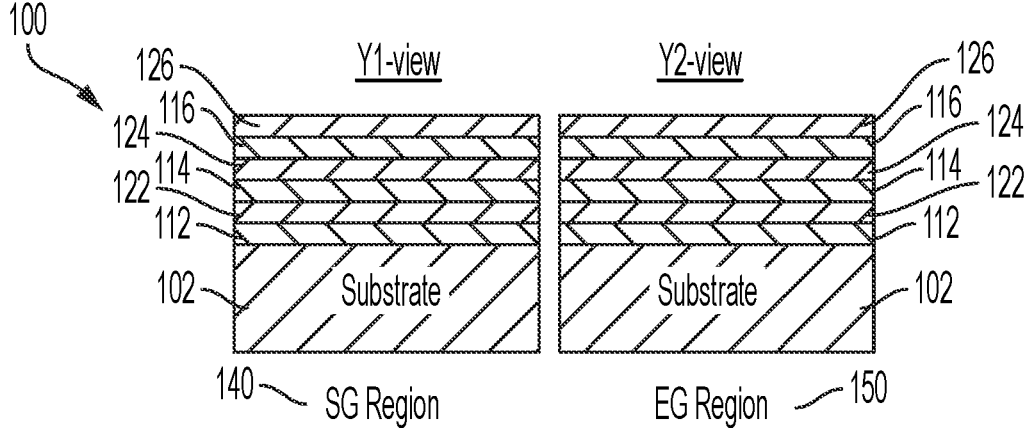

It is understood in advance that although this invention includes a detailed description of exemplary standard-gate (SG) and extended-gate (EG) FET architectures having silicon (Si) channels, embodiments of the invention are not limited to the particular FET architectures or materials described in this specification. Rather, embodiments of the present invention are capable of being implemented in conjunction with any other type of FET architecture (e.g., nanosheet FETs; vertical transport FETs; FinFETs; stacked FETS; and the like) or channel materials (e.g., Si, SiGe, III-V semiconductors, and the like) now known or later developed. Additionally, in this detailed description and the claims, the terms nanosheet and nanowire are treated as synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Non-planar transistor device architectures (e.g., fin-type FETs (FinFETs) and nanosheet FETs) can provide increased device density and increased performance over planar transistors. FinFETs are non-planar, three-dimensional (3D) devices that include a fin-shaped element that defines the source, drain, and channel regions of the FinFET. A gate stack is formed over and around a central region of the fin-shaped element, and the portion of the fin that is under the gate stack functions as the FinFET channel. The portions of the fin-shaped element that are not under the gate stack function as the source region and the drain region, respectively.

Nanosheet transistors are non-planar FETs that increase channel conductivity and decrease FET size by forming the channel as a nanostructure. For example, a so-called gate-all-around (GAA) nanosheet FET provides a relatively small FET footprint by forming the channel region as a series of nanosheets. In a known GAA configuration, a nanosheet-based FET includes a source region, a drain region and stacked, spaced-apart nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized.

For n-type FETs, the channel nanosheets are typically silicon (Si) and the sacrificial nanosheets are typically silicon germanium (SiGe). For p-type FETs, the channel nanosheets are typically SiGe and the sacrificial nanosheets are typically Si. In some implementations, the channel nanosheet of a p-type FET can be SiGe or Si, and the sacrificial nanosheet can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although non-planar FET architectures provide increased device density over planar FET architectures, there are still challenges when attempting to fabricate non-planar FETs that provide the performance characteristics required for a broad range of applications. For example, some applications use so-called standard-gate (SG) transistors configured to tolerate a maximum gate/threshold voltage ($V_T$) at a predetermined SG level. For some applications (e.g., input/output (I/O) circuitry), transistors need to tolerate a $V_T$ that is higher than SG $V_T$ levels. In order to increase the maximum $V_T$ of certain transistors, so-called extended-gate (EG) transistors have been developed that include a larger volume of gate metal and/or a thicker gate dielectric (e.g., an oxide) than so-called SG transistors. Accordingly, it is necessary to fabricate semiconductor wafers having both SG (thin gate oxide) and EG (thick gate oxide) transistors on the same IC substrate.

However, it is difficult to extend current non-planar SG transistor fabrication processes to support the direct fabrication of both SG and EG non-planar transistors on the same IC substrate for a variety of reasons. For example, with nanosheet FETs, because of the relatively small space (e.g., about 5 nm to about 15 nm) provided between the channel nanosheets in standard SG nanosheet transistor fabrication, there is insufficient room for the larger volume of gate metal and/or the thicker gate oxide that are required for EG transistors. Additionally, known fabrication techniques use a furnace anneal or a rapid thermal anneal (RTA) to apply high-temperature anneals (e.g., from about 800 degrees Celsius to about 1000 degrees Celsius) to thick EG gate oxides to improve the EG gate oxide's quality. However, such high-temperature EG oxide anneals cause an undesirable level or rate of intermixing (or diffusion) at the interface between Si and SiGe in the non-planar FETs that are under fabrication.

Turning now to an overview of aspects of the invention, embodiments of the invention provide fabrication processes and resulting structures for forming SG transistors and EG transistors on the same substrate using gate dielectric treatments that improve the quality or integrity of relatively thick (e.g., from about 2 nm to about 5 nm) EG dielectrics by reinforcing the relatively thick EG dielectric at low-temperatures (e.g., less than about 800 degrees Celsius). In embodiments of the invention, any combination of non-planar SG and EG transistor types (e.g., nanosheet FETs; vertical transport FETs; FinFETs; stacked FETS; and the like) and/or channel materials (e.g., Si, SiGe, III-V semiconductors, and the like) can be provided. In some embodiments of the invention, the SG transistor is implemented as a nanosheet FET, and the EG transistor is implemented as a FinFET. In accordance with aspects of the invention, in order to have a low thermal budget that minimizes undesirable levels (or rates) of diffusion of semiconductor material across interfaces between Si and SiGe in the SG and/or EG transistors, a first thicker (e.g., from about 2 nm to about 5 nm) EG dielectric of the EG transistors is deposited at a low-temperature (e.g., less than about 400 degrees Celsius). A dielectric reinforcement treatment is applied to the first EG dielectric at a low-temperature (e.g., less than about 800 degrees Celsius) to generate a reinforced first EG dielectric having improved or reinforced quality over the first EG dielectric. In some embodiments of the invention the dielectric reinforcement treatment is a nitridation treatment performed at a low-temperature (e.g., less than about 800 degrees Celsius), and the resulting reinforced first EG dielectric includes the EG dielectric reinforced with a nitride. In some embodiments of the invention the dielectric reinforcement treatment is a plasma densification performed at a low-temperature (e.g., less than about 800 degrees Celsius), and the resulting reinforced first EG dielectric includes the EG dielectric reinforced with reinforcement elements such as helium, argon, hydrogen, and the like.

In some embodiments of the invention, an SG dielectric (e.g., an interfacial layer and a high-k dielectric layer) is provided over the reinforced first EG dielectric, wherein a thickness (e.g., from about 0.1 nm to about 1 nm) of the SG dielectric is less than a thickness (e.g., from about 2 nm to about 5 nm) of the reinforced first EG dielectric. In some embodiments of the invention, a second EG dielectric is provided between the reinforced first EG dielectric and the SG dielectric, wherein the thickness of the SG dielectric is less than the thickness of the second EG dielectric.

In accordance with aspects of the invention, the low-temperature EG dielectric deposition and the low-temperature EG dielectric reinforcement treatment are performed at temperatures that are less than a temperature that would induce an unacceptable level or rate of intermixing between Si and SiGe in the SG and/or EG transistors. More specifically, the low-temperature (e.g., less than about 400 degrees Celsius) of the EG dielectric deposition and the low-temperature (e.g., less than about 800 degrees Celsius) of the EG dielectric reinforcement operation are selected to be below a "maximum diffusion" temperature (e.g., about 800 degrees Celsius for Si and SiGe) that causes a diffusion of a first type of semiconductor material across an interface and into a second type of semiconductor such that the diffusion exceeds a predetermined maximum. diffusion level or rate.

Figure 15:
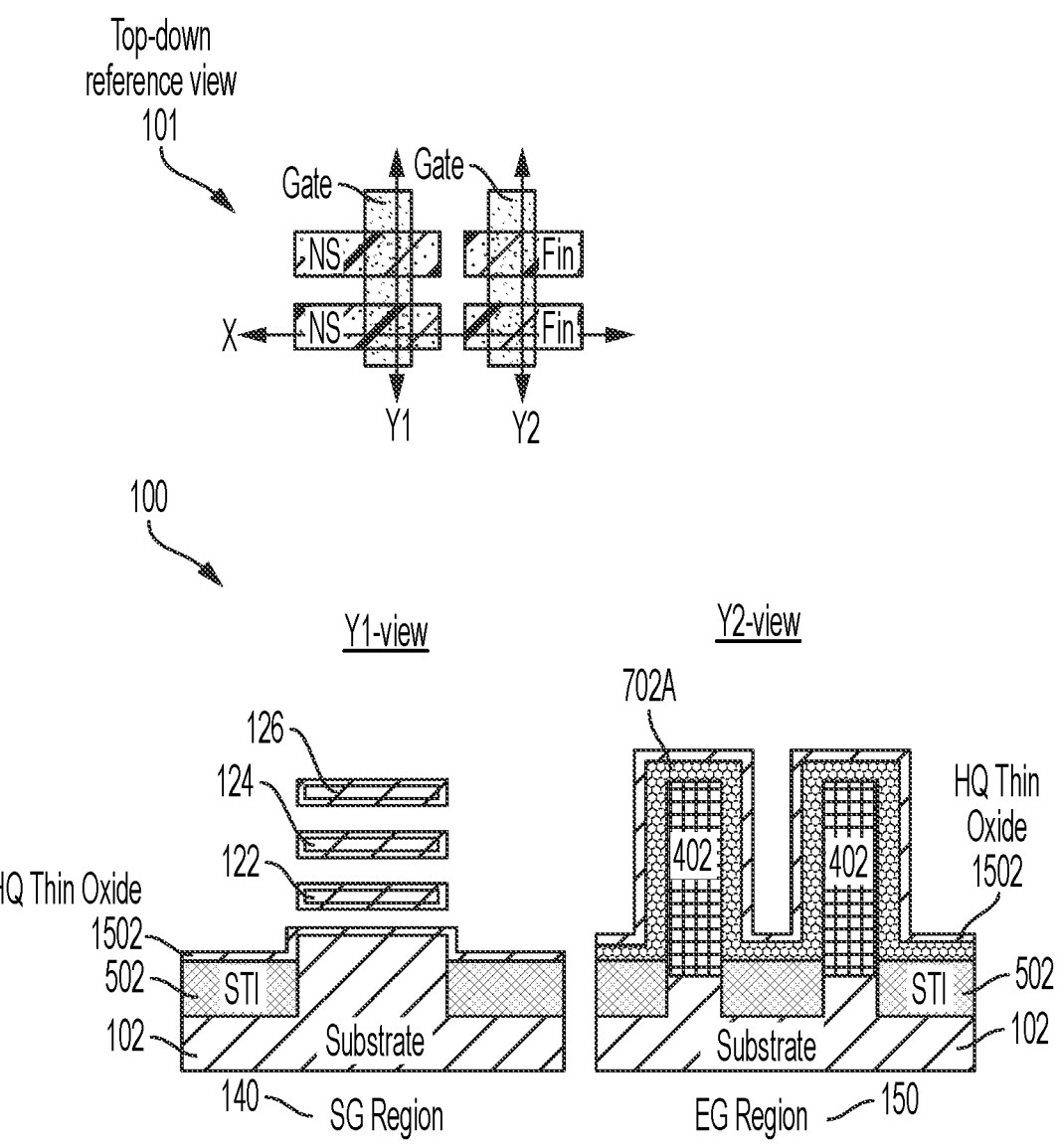
Figure 15:
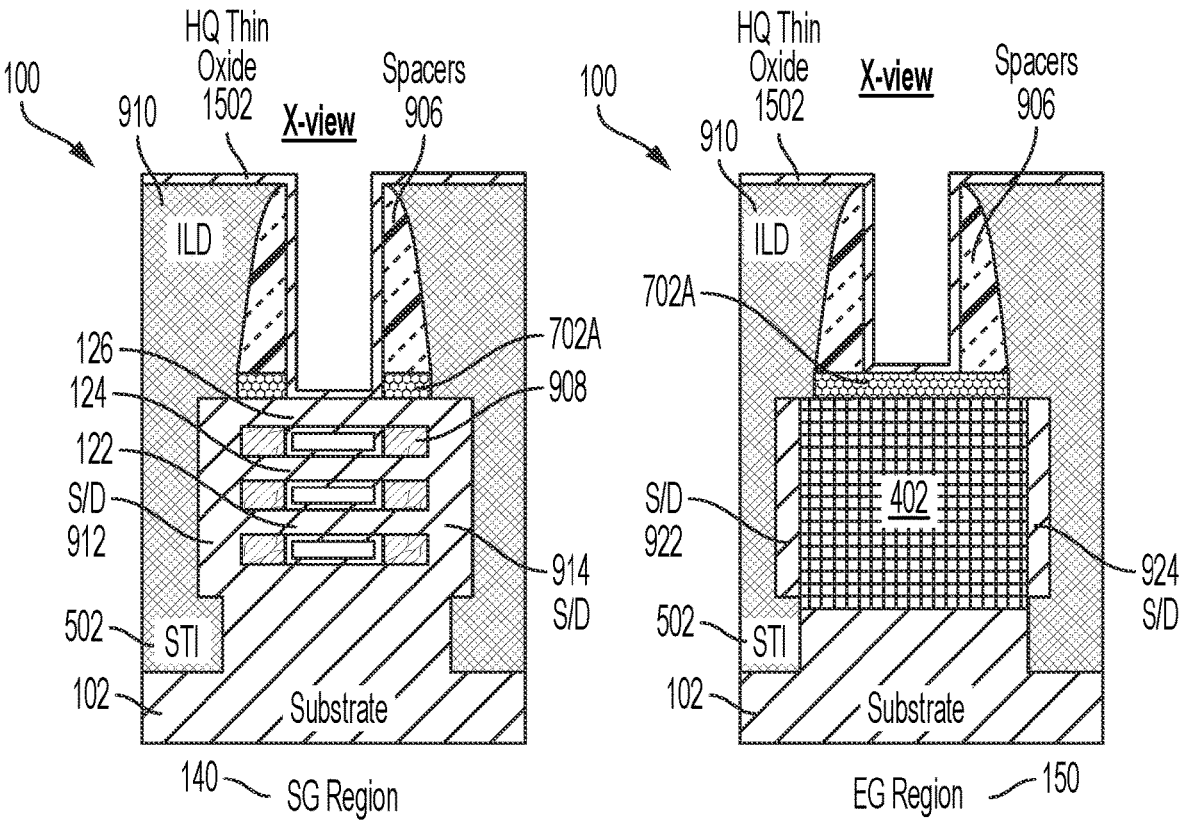
Figure 16:
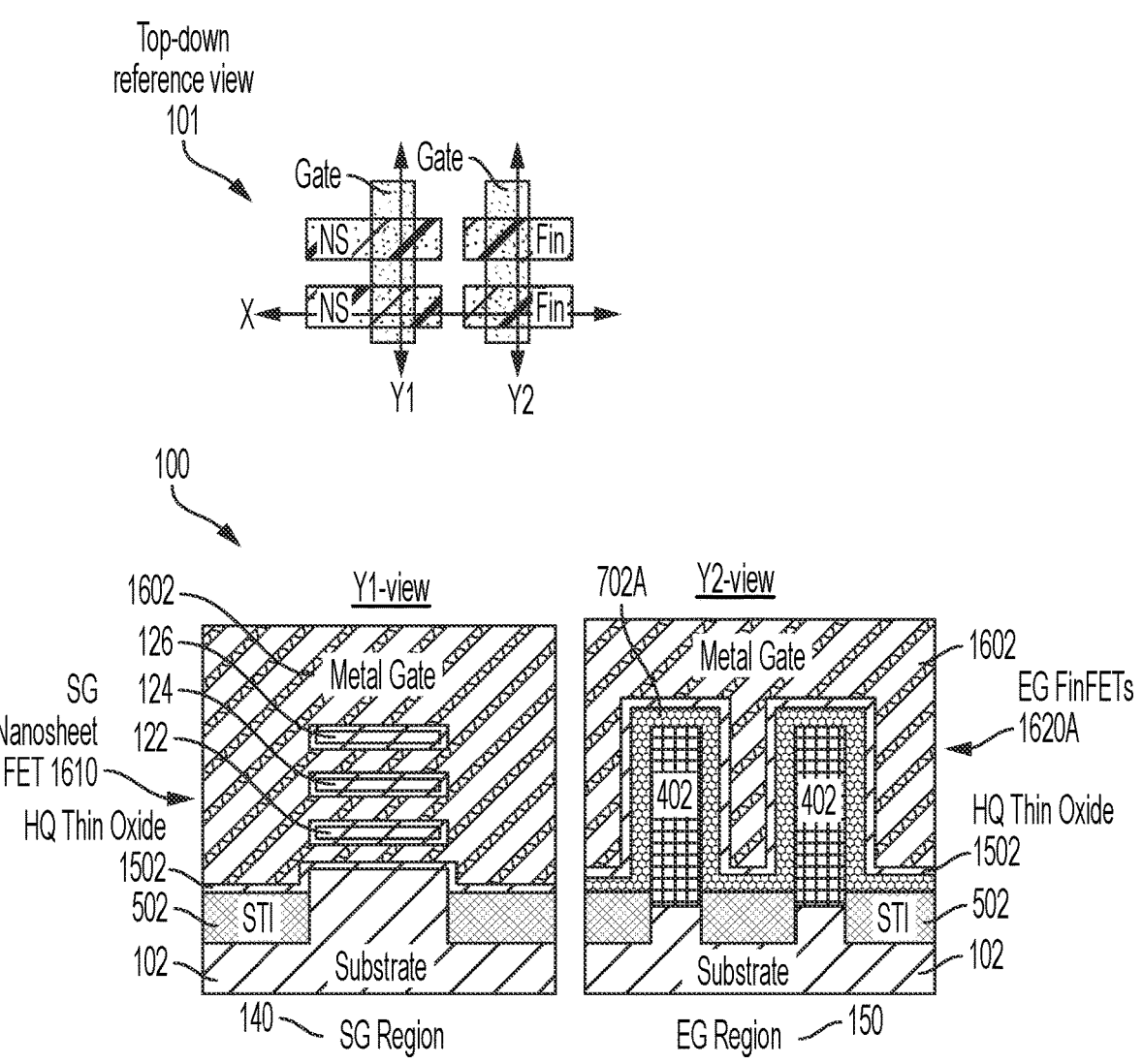
Figure 16:
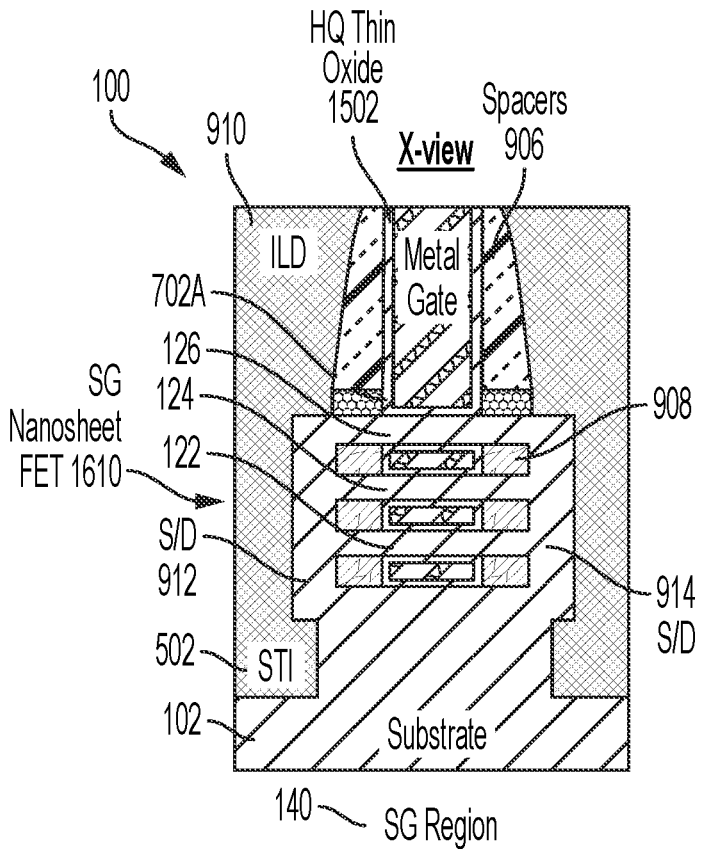
Figure 16:
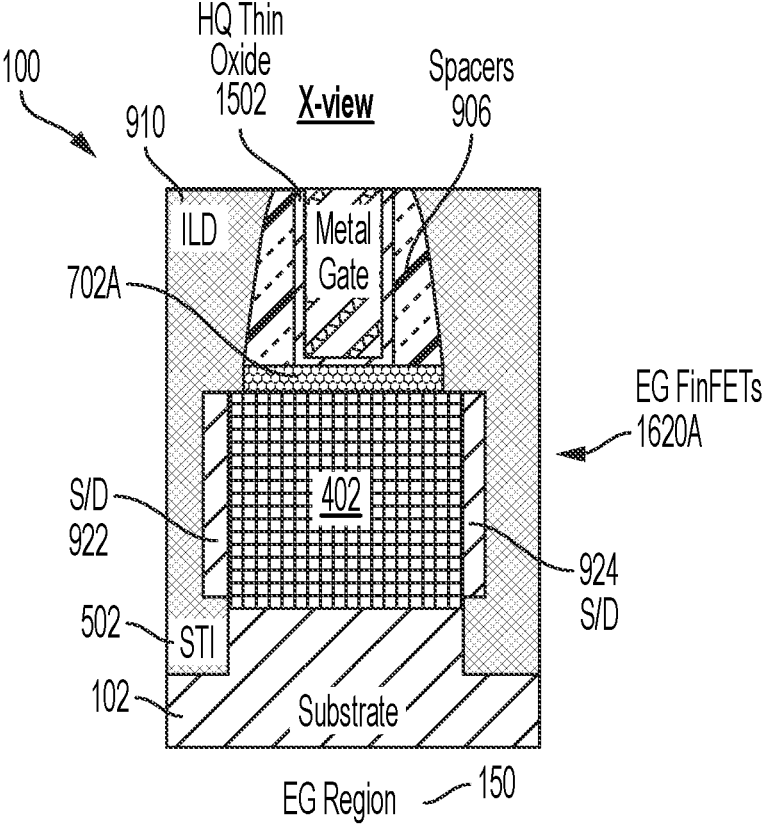

Turning now to a more detailed description of embodiments of the invention, FIG. 16 depicts an SG nanosheet FET 1610 formed in an SG region 140 of a substrate 102, along with two (2) in-series EG FinFETs 1620A formed in the EG region 150 of the substrate 102. The SG nanosheet FET 1610 and the EG FinFETs 1620A result from the fabrication operations depicted in FIGS. 1-16. The SG nanosheet FET 1610 includes a relatively thin (e.g., from about 0.5 nm to about 1 nm) gate oxide 1502 formed from a high-quality (HQ) interfacial layer (IL) and a high-k dielectric. Each EG FinFET 1620A includes a relatively thick (e.g., from about 2 nm to about 5 nm) gate oxide formed from the gate oxide 1502 and a reinforced EG oxide 702A. Accordingly, the relatively thick EG gate oxide 1502/702A enables each EG FinFET 1602A to be used in applications (e.g., input/output (I/O) circuitry) that require transistors configured to tolerate a $V_T$ that is higher than SG $V_T$ levels.

Figure 17:
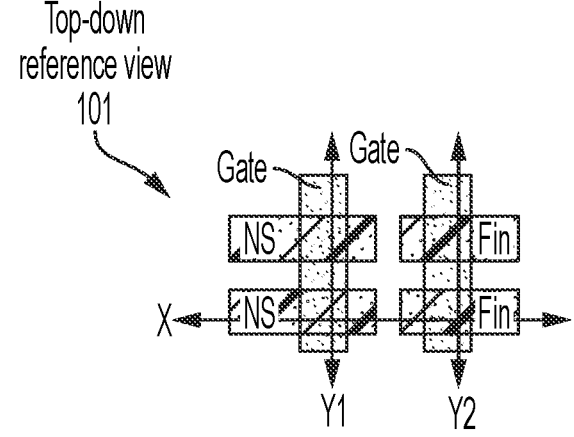
Figure 17:
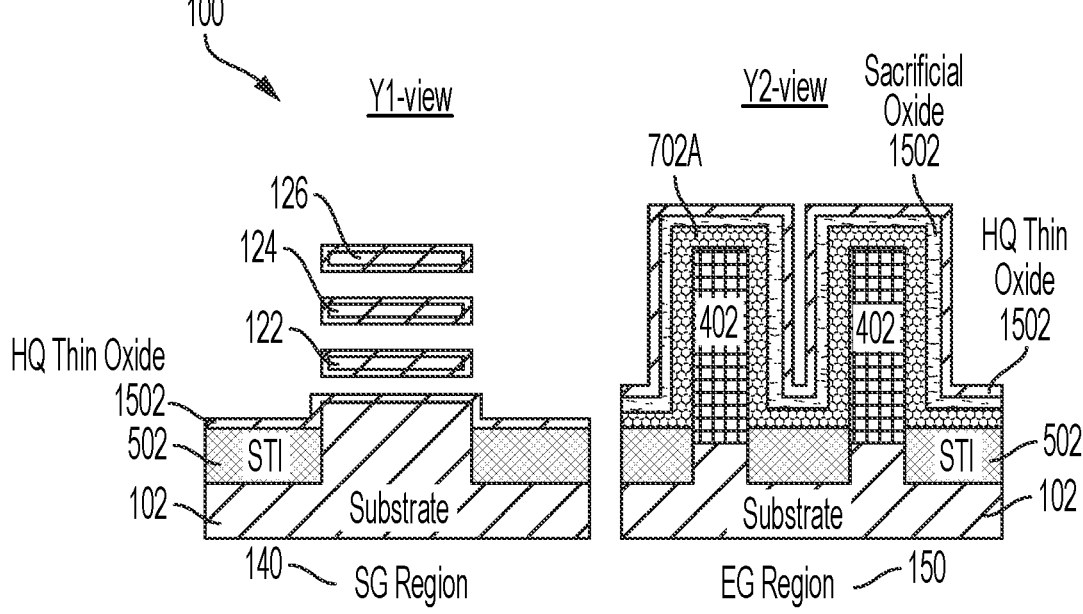
Figure 17:
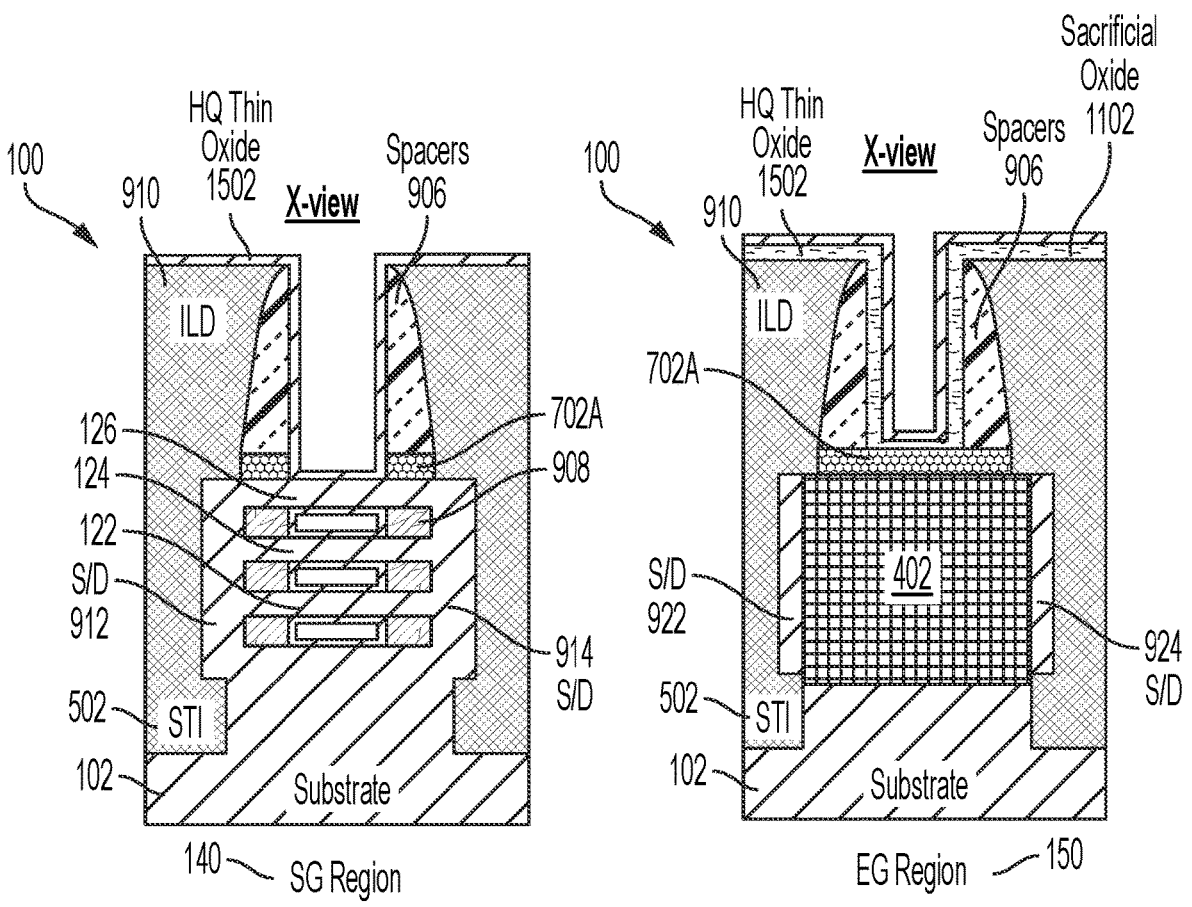
Figure 18:
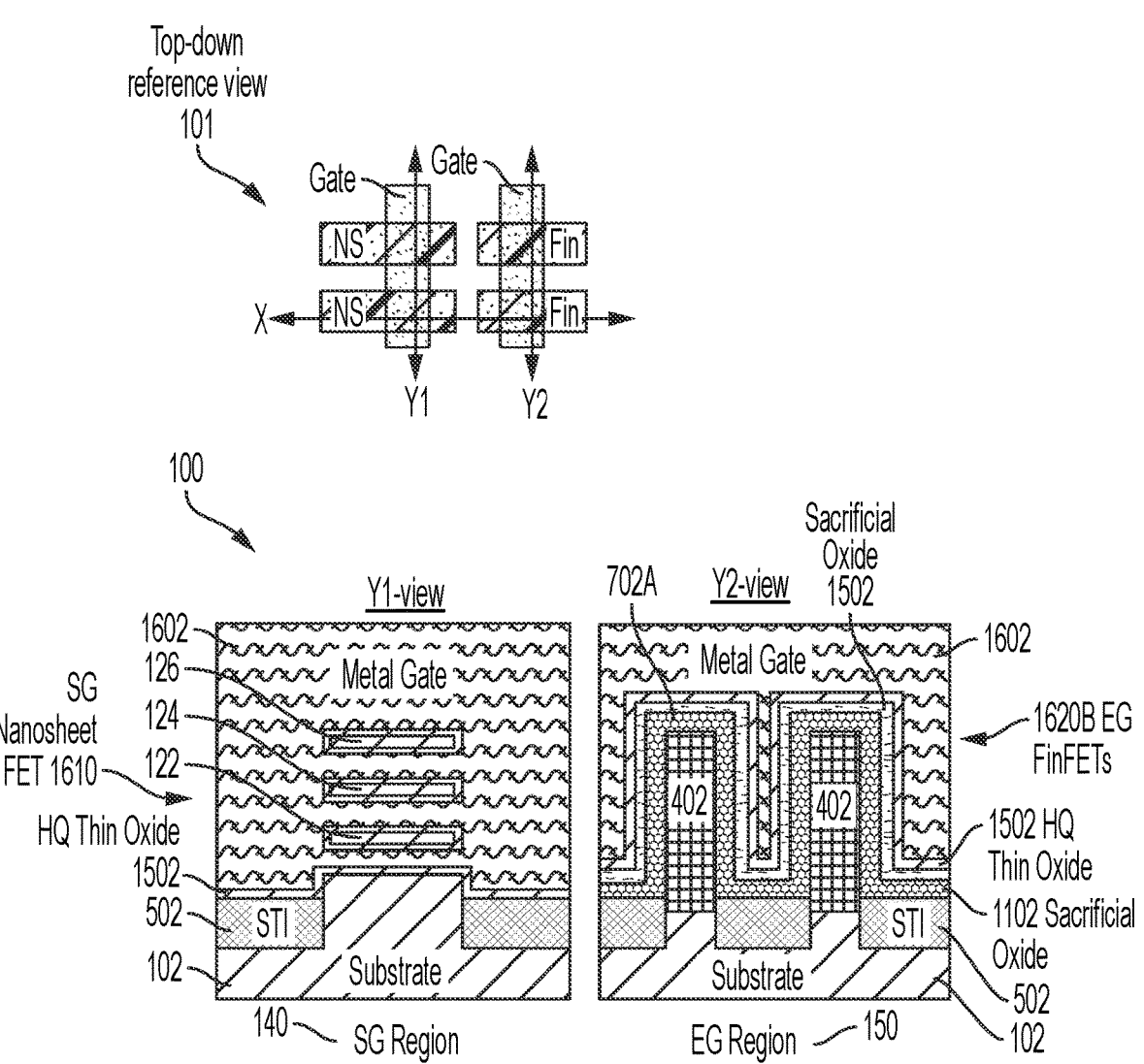
Figure 18:
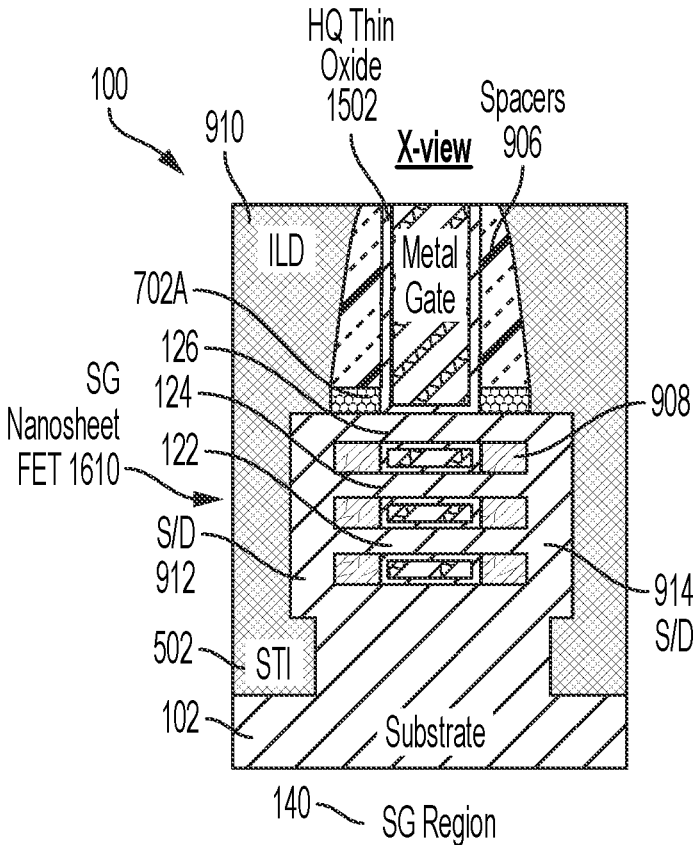
Figure 18:
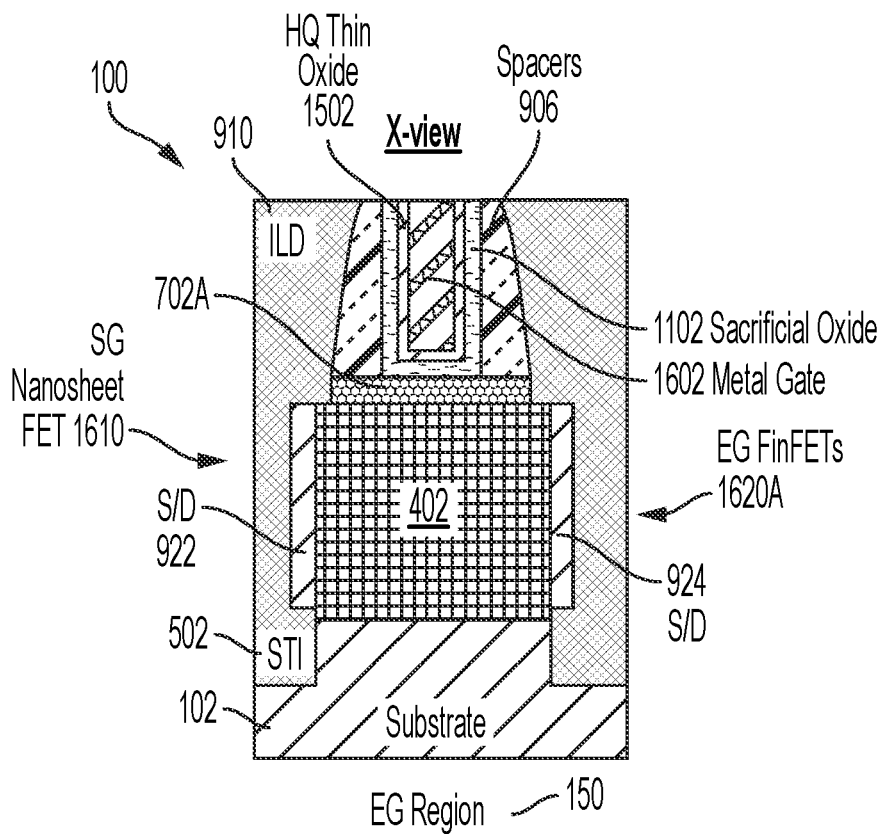

FIG. 18 depicts the SG nanosheet FET 1610 formed in the SG region 140 of the substrate 102, along with two (2) in-series EG FinFETs 1620B formed in the EG region 150 of the substrate 102. The SG nanosheet FET 1610 and the EG FinFETs 1620B result from the fabrication operations depicted in FIGS. 1-14, 17, and 18. The SG nanosheet FET 1610 includes a relatively thin (e.g., from about 0.5 nm to about 1 nm) gate oxide 1502 formed from a HQ IL and a high-k dielectric. Each EG FinFET 1620B includes a relatively thick (e.g., from about 3.5 nm to about 9 nm) gate oxide formed from the gate oxide 1502, the reinforced EG oxide 702A, and a protective sacrificial oxide 1102. Accordingly, the relatively thick EG gate oxide 1502/1102/702A enables each EG FinFET 1602B to be used in applications (e.g., I/O circuitry) that require transistors configured to tolerate a $V_T$ that is higher than SG $V_T$ levels.

FIGS. 1-18 depict cross-sectional views of portions of an IC 100 after various fabrication operations to form the SG nanosheet FET device 1610 (shown in FIGS. 16 and 18) in the SG region 140 of the substrate 102, along with the EG FinFETs 1620A, 1620B (shown in FIGS. 16 and 18) in an EG region 150 of the substrate 102. Although the cross-sectional diagrams depicted in FIGS. 1-18 are two-dimensional, it is understood that the diagrams depicted in FIGS. 1-18 represent three-dimensional structures. To assist with visualizing the three-dimensional features, a top-down reference diagram 101 in the figures provides a reference point for the cross-sectional views (X-view, Y1-view, and/or Y2-view) shown in FIGS. 1-18. The X-view is a side view taken across the gates, the Y1-view is an end view taken through the active gate that crosses the nanosheets (NS) of the SG device, and the Y2-view is an end view taken through the active gate that crosses the fin portions of the EG device. For ease of illustration and explanation, a limited number of SG and EG transistor devices are depicted. It should be understood, however, that any number of SG and EG transistor device can be formed on the substrate 102 in accordance with embodiments of the invention described herein.

In FIG. 1, after initial stages of the described fabrication processes, the SG region 140 and the EG region 150 of the substrate 102 are the same. As shown in FIG. 1, an alternating series of sacrificial nanosheet layers 112, 114, 116 (e.g., SiGe) and non-sacrificial nanosheet layers 122, 124, 126 (e.g., Si) are formed in a stack on the substrate 102. In some embodiments of the invention, the sacrificial nanosheet layers 112, 114, 116 can be SiGe 25%. The notation "SiGe 25%" is used to indicate that 25% of the SiGe material is Ge.

In embodiments of the invention, the alternating nanosheet layers depicted in FIG. 1 can be formed by epitaxially growing one layer and then the next until the desired number and desired thicknesses of the nanosheet layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si: C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2:
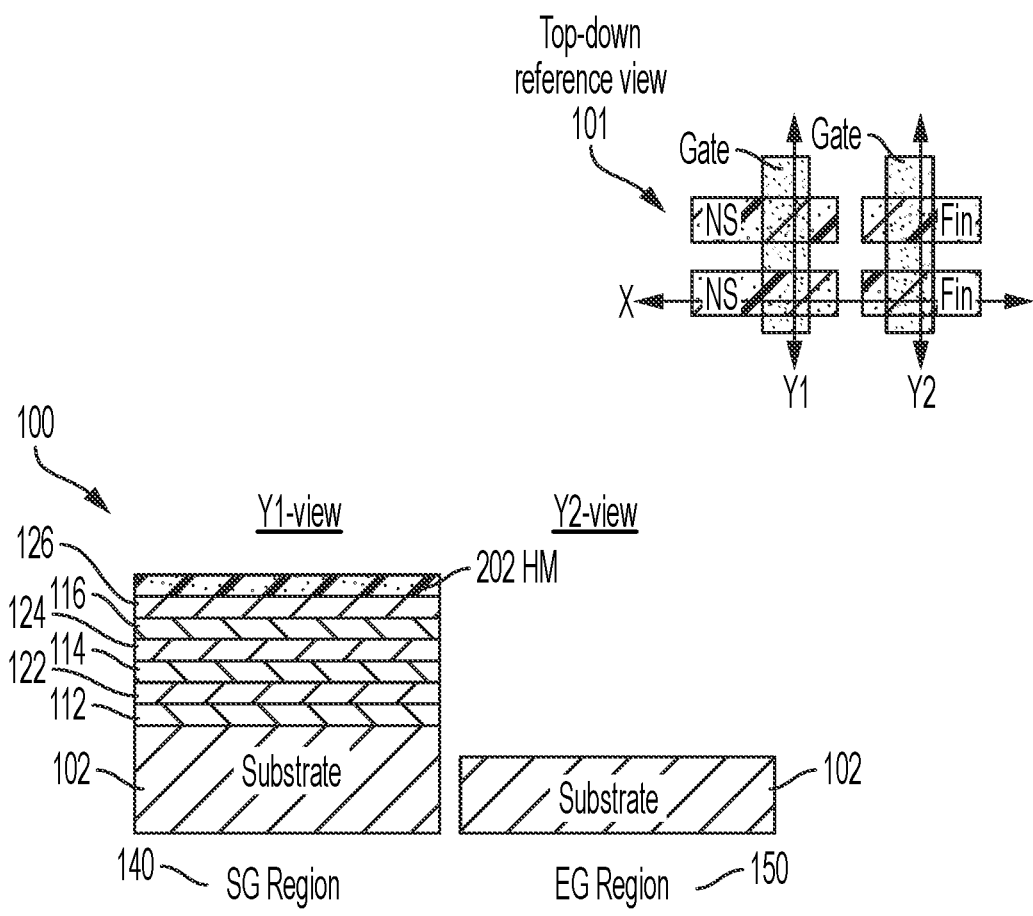

In FIG. 2, a hard mask (or block mask) 202 is placed over the SG region 140, leaving exposed the EG region 150 of the substrate 102. Known semiconductor fabrication techniques have been used to remove the sacrificial nanosheets 112, 114, 116 and the non-sacrificial nanosheets 122, 124, 126 that are not under the hard mask 202.

Figure 3:
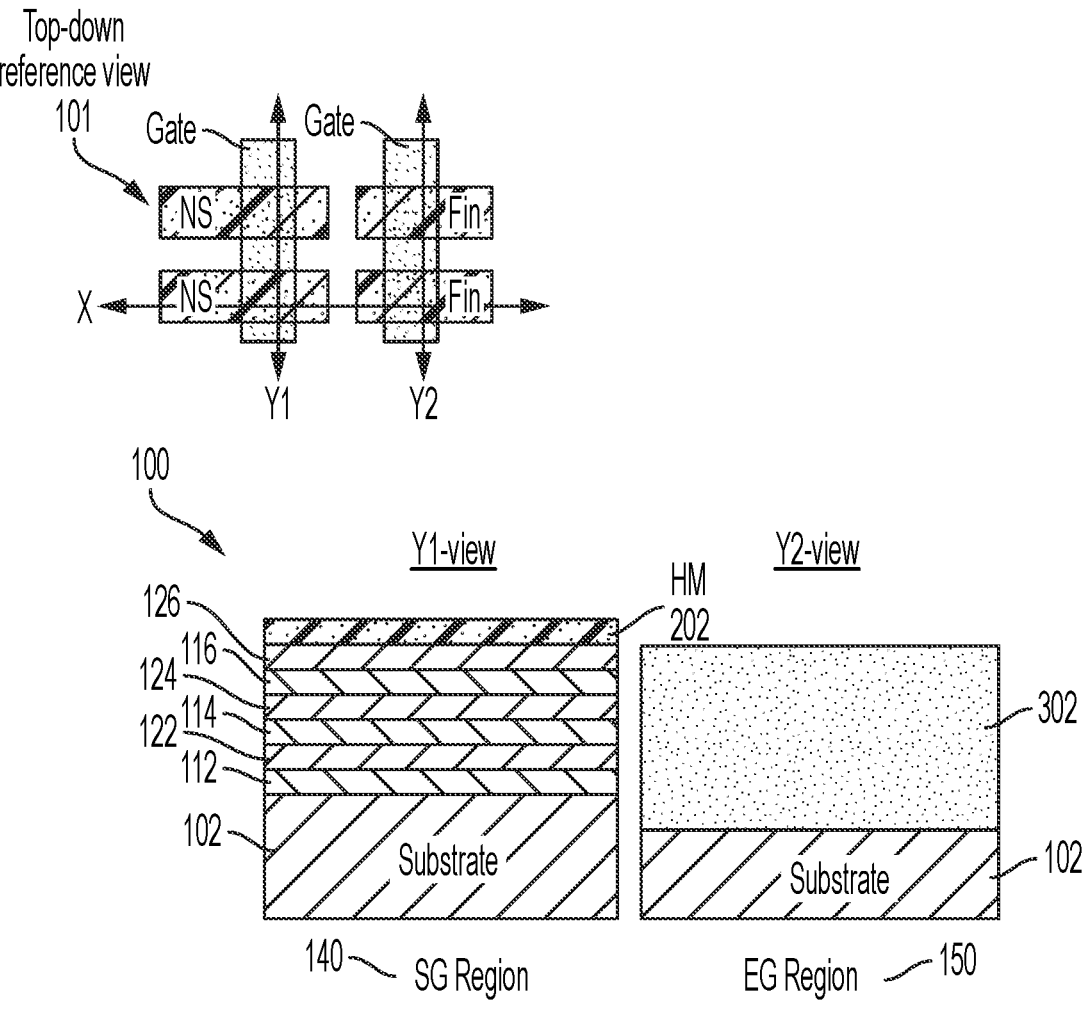

In FIG. 3, known semiconductor fabrication techniques have been used to form a region of semiconductor material 302 (e.g., Si) from which channel fins 402 (shown in FIG. 4) will be formed. In some embodiments of the invention, the semiconductor material 302 can be Si with different doping than the Si in the substrate 102. The semiconductor material 302 can be epitaxially grown from an exposed top surface of the substrate 102 in the EG region 150.

Figure 4:
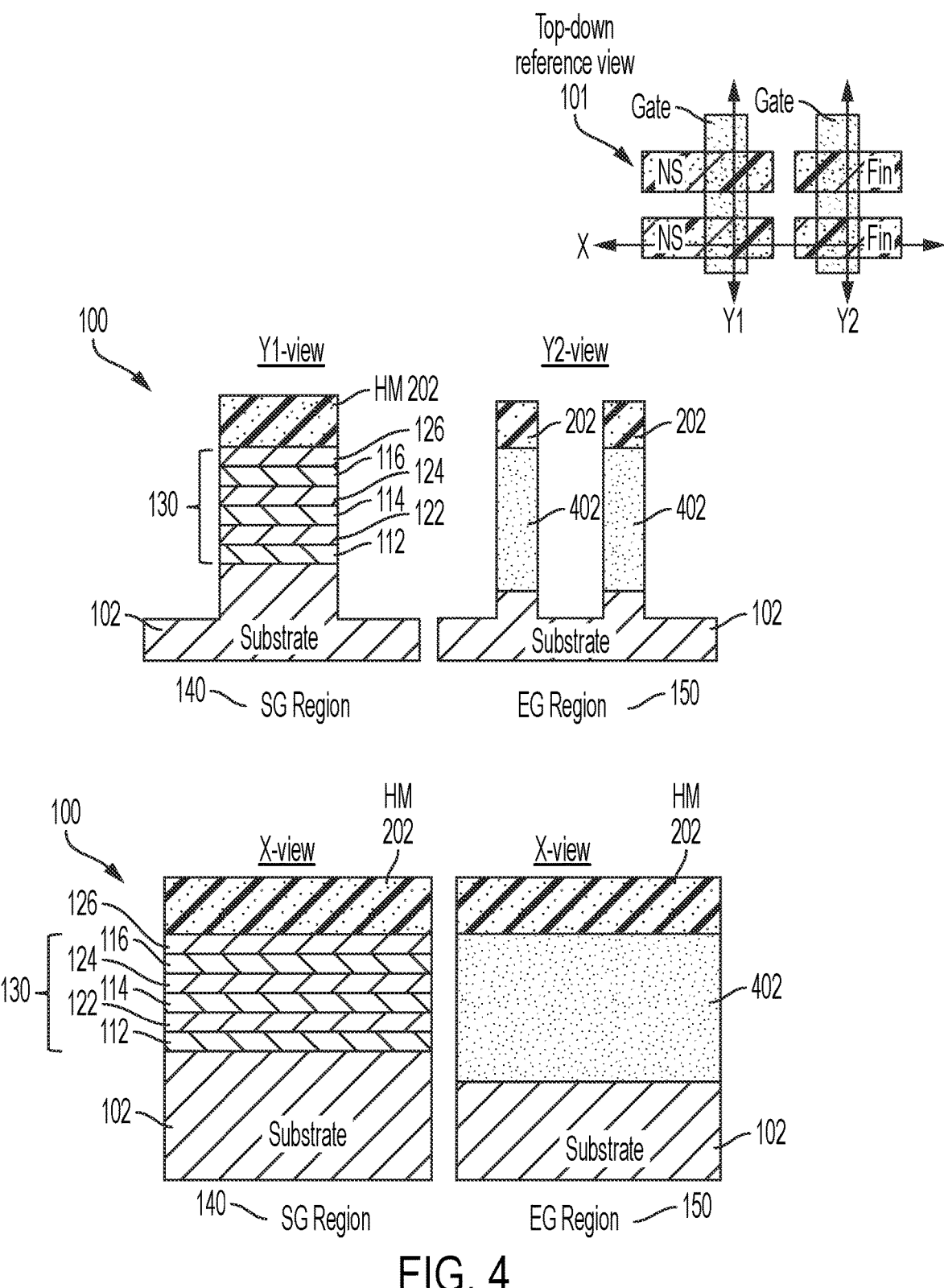

In FIG. 4, known fabrication operations have been used to deposit and pattern additional layers of the hard mask 202 that are patterned to define a fin-shaped stack 130 in the SG region 140, and also define fins 402 in the EG region 150. In the SG region 140, known semiconductor fabrication operations have been used to etch or recess the alternating nanosheet layers 112, 122, 114, 124, 116, 126 to form the fin-shaped stack 130. In the EG region 150, known semiconductor fabrication operations have been used to etch or recess the semiconductor material 302 to form the fins 402.

Figure 5:
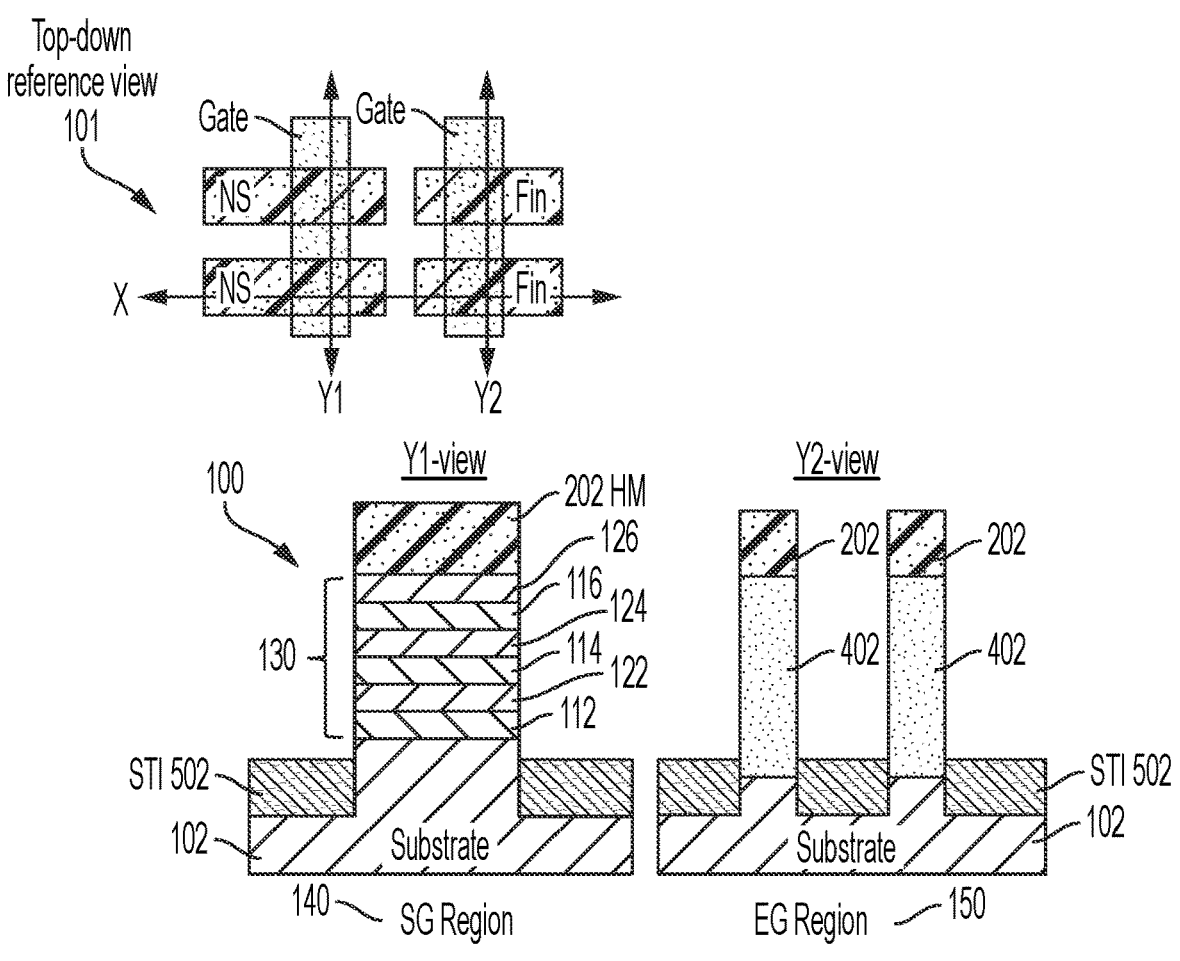
Figure 5:
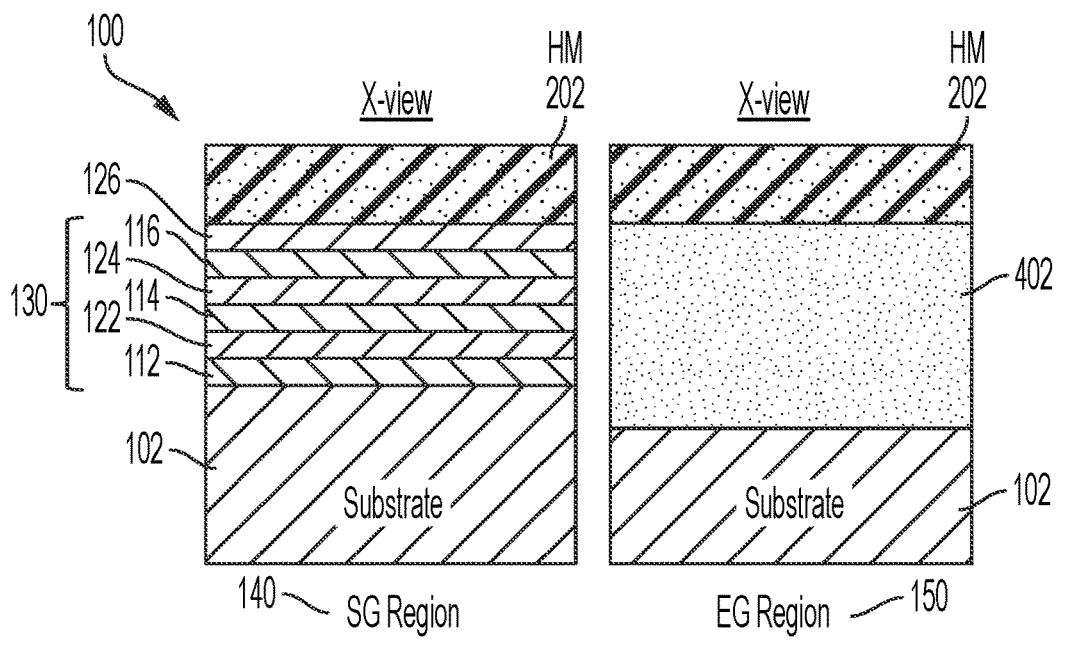

In FIG. 5, known fabrication operations have been used to provide transistor isolation by forming shallow trench isolation (STI) regions 502 between the stack 130 in the SG region 140 and the EG region 150 and the fins 402 shown in the EG region 150. In embodiments of the invention, the STI regions 502 can be formed by depositing bulk dielectric material between over the IC 100 and recessing the bulk dielectric to the desired level.

Figure 6:
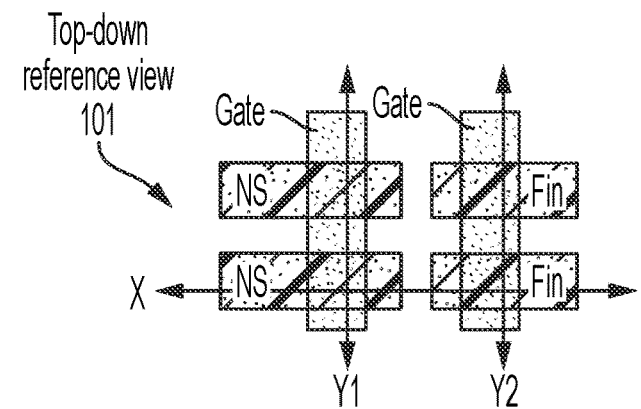
Figure 6:
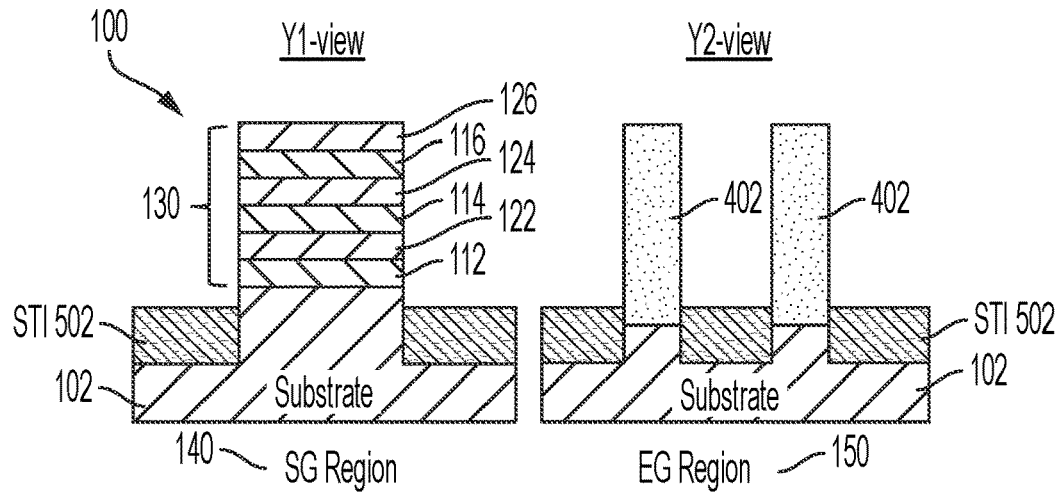
Figure 6:
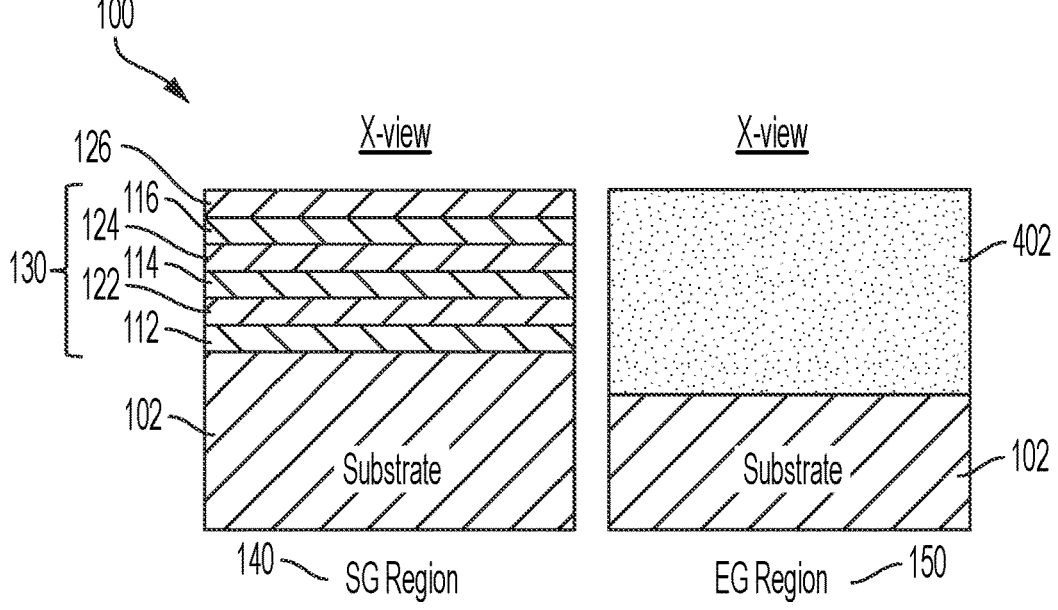

In FIG. 6, known fabrication operations have been used to remove the patterned hard masks 202 in the SG region 140 and the EG region 150.

Figure 7:
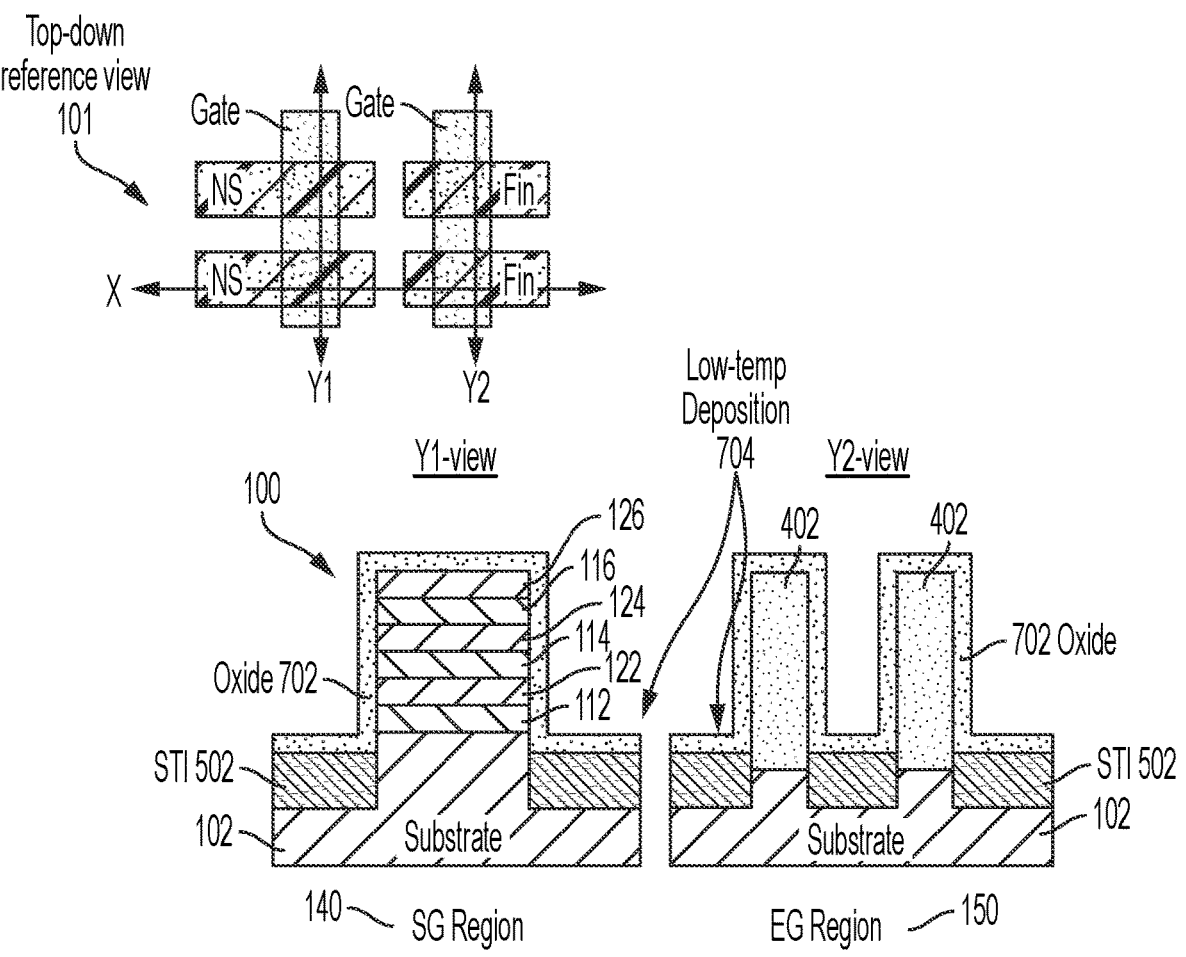
Figure 7:
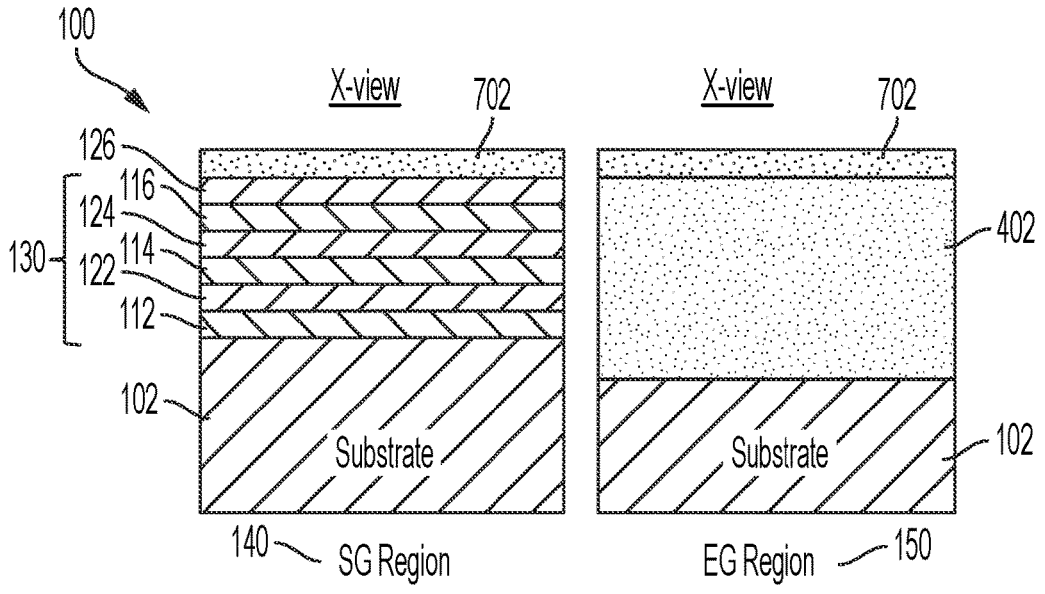

In FIG. 7, in accordance with aspects of the invention, in order to have a low thermal budget that minimizes undesirable intermixing diffusion between Si (e.g., non-sacrificial nanosheets 112, 114, 116) and SiGe (e.g., sacrificial nanosheets 122, 124, 126) in the SG region 140 and the EG regions 150, an EG oxide 702 is deposited at a low-temperature (e.g., less than about 400 degrees Celsius). The low-temperature deposition process is used to deposit the EG oxide 702 over the IC 100. The EG oxide 702 is provided with a thickness that is sufficient to provide EG devices (e.g., input/output (I/O) circuitry) formed in the EG region 150 with the ability to tolerate a $V_T$ that is higher than SG $V_T$ levels. In some embodiments of the invention, the thickness of the EG oxide 702 is between about 1.5 nm and about 4 nm. The EG oxide 702 can include one or more dielectric materials suitable for forming an oxide. The EG oxide 702 can be formed by suitable deposition processes, for example, CVD, PECVD, atomic layer deposition (ALD), evaporation, physical vapor deposition (PVD), chemical solution deposition, or other like processes performed at low-temperatures (e.g., less than about 400 degrees Celsius).

Figure 8:
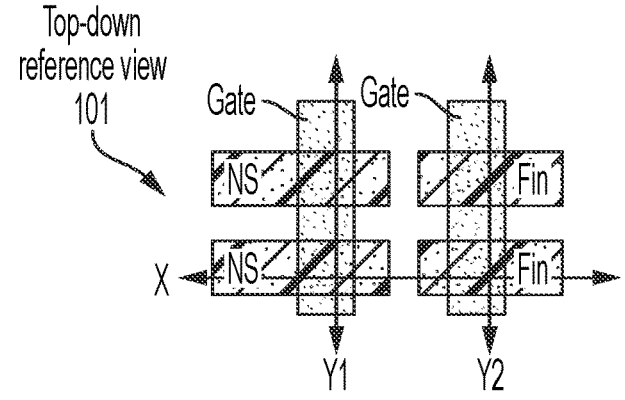

In FIG. 8, a low-temperature (e.g., less than about 800 degrees Celsius) reinforcement treatment 802 is used to reinforce the EG oxide 702, thereby forming a reinforced EG oxide 702A. The thickness of the EG oxide 702 is substantially retained after the low-temperature reinforcement treatment 802. Accordingly, the reinforced EG oxide 702A is also provided with a thickness that is sufficient to provide EG devices (e.g., input/output (I/O) circuitry) formed in the EG region 150 with the ability to tolerate a $V_T$ that is higher than SG $V_T$ levels. Similar to the EG oxide 702, in some embodiments of the invention, the thickness of the reinforced EG oxide 702A is between about 1.5 nm and about 4 nm. The low-temperature oxide reinforcement treatment 802 is applied to the EG oxide 702 to generate the reinforced EG oxide 702A with improved quality over the EG oxide 702. In some embodiments of the invention the oxide reinforcement process is a nitridation treatment process performed at a low-temperature (e.g., less than about 800 degrees Celsius), and the resulting reinforced EG oxide 702A includes the EG oxide 702 reinforced with a nitride. In some embodiments of the invention the oxide reinforcement process is a plasma densification process performed at a low-temperature (e.g., less than about 800 degrees Celsius), and the resulting reinforced EG oxide 702A includes the EG oxide 702 reinforced with elements such as helium, argon, hydrogen, and the like.

In accordance with aspects of the invention, the low-temperature EG oxide deposition and the low-temperature EG oxide reinforcement process depicted in FIG. 8 are performed at temperatures that are less than a temperature that would induce an unacceptable level of intermixing diffusion between Si (e.g., non-sacrificial nanosheets 112, 114, 116) and SiGe (e.g., sacrificial nanosheets 122, 124, 126) in the SG region 140 and the EG region 150. More specifically, the low-temperature of the EG oxide deposition and the low-temperature of the EG oxide reinforcement operation are selected to be below a "maximum diffusion" temperature that causes a diffusion of a first type of semiconductor material across an interface and into a second type of semiconductor such that the diffusion exceeds a predetermined maximum. diffusion level.

Figure 9:
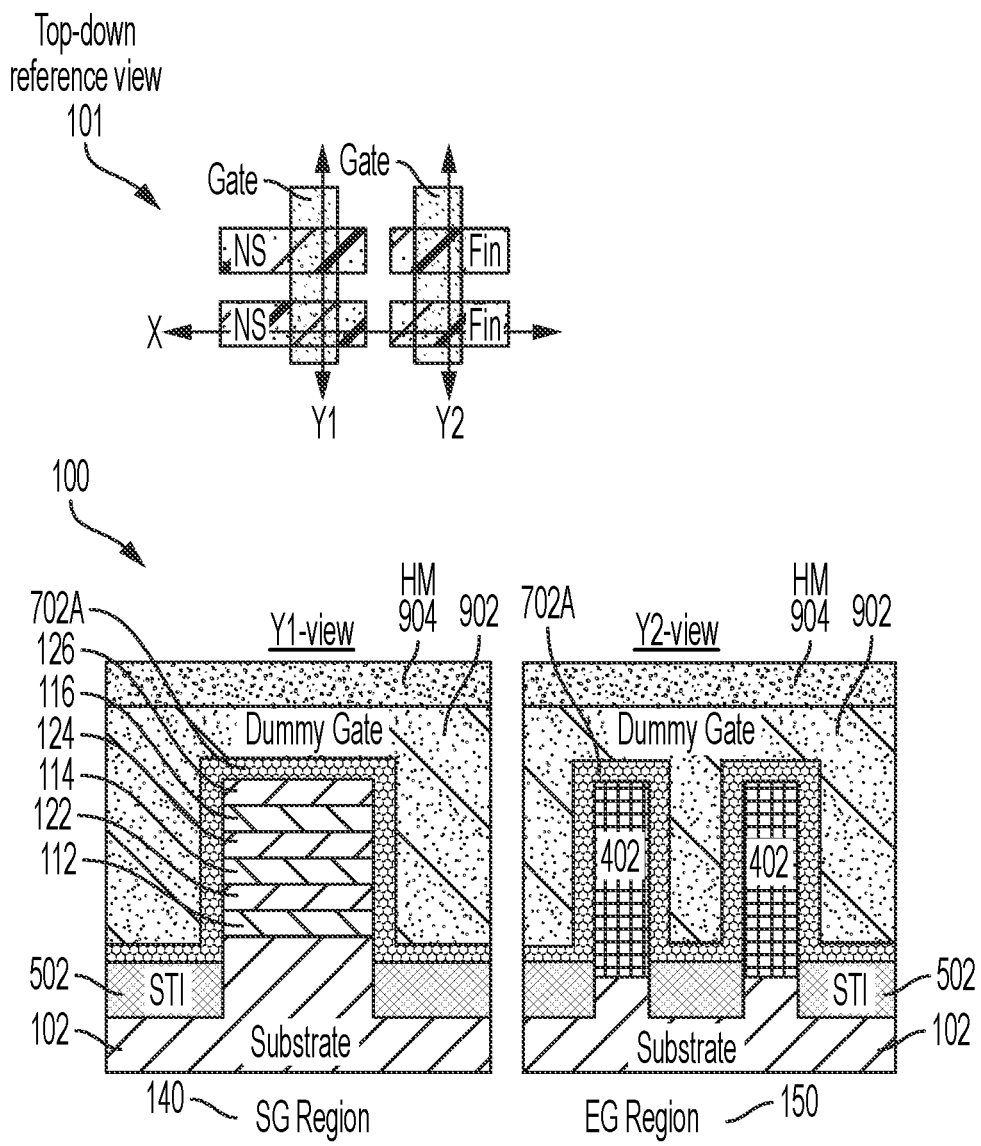
Figure 9:
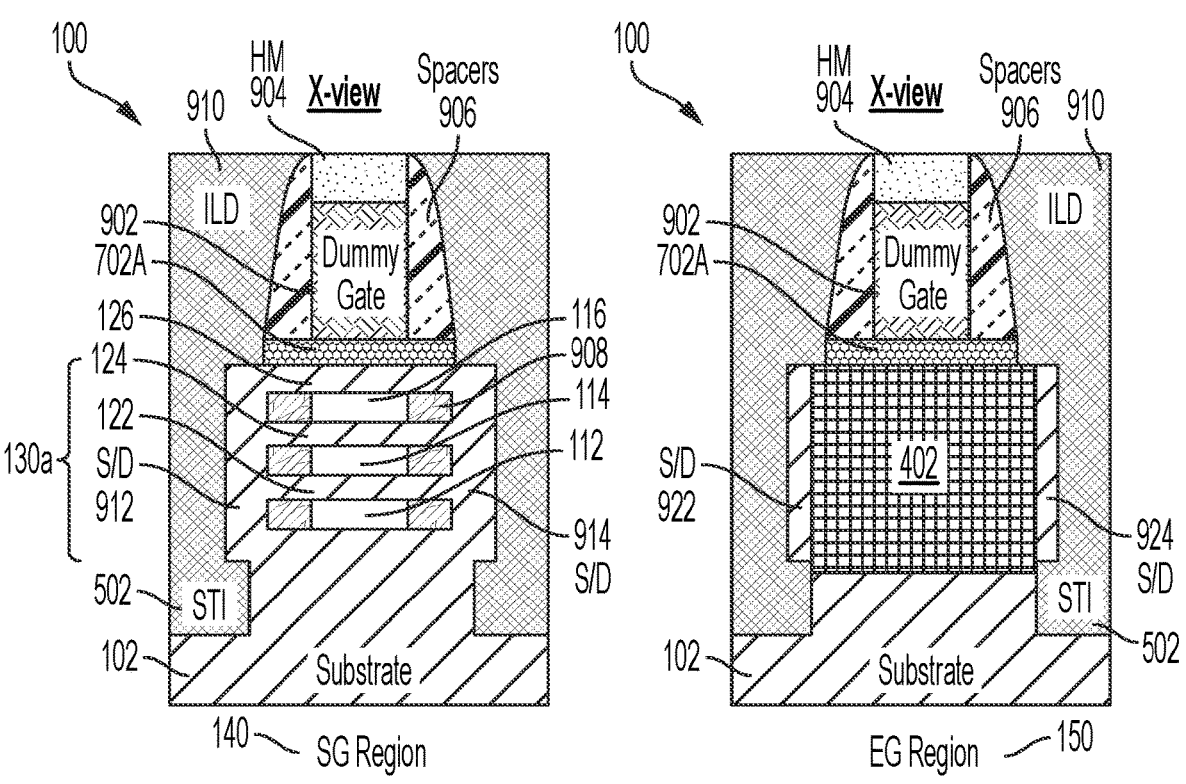

In FIG. 9, known semiconductor fabrication operations have been used to form dummy gates 902, hard masks 904, gate spacers 906, SG inner spacer 908, S/D regions 912, 914, 922, 924, and an interlayer dielectric (ILD) region 910, configured and arranged as shown. For selected fabrication operations that apply only to the SG region 140 or only to the EG region 150, an appropriate blocking mask is applied to isolation the target region of the substrate 102. Known semiconductor fabrication operations have been used to form dummy gates 902 and hard masks 904 that extend over and around each stack 130 in the SG region 140 and each fin 402 in the EG region 150. The dummy gates 902 can be formed by depositing amorphous silicon (a-Si) over and around the stack 130 and the fins 402. The a-Si is then planarized to a desired level. A hard mask layer (not shown) is deposited over the planarized a-Si and patterned to form the hard masks 904. In embodiments of the invention, the hard masks 904 can be formed from a nitride or an oxide layer. An etching process (e.g., an RIE) is applied to the a-Si to form the dummy gates 902.

Referring still to FIG. 9, known semiconductor fabrication operations have been used to form offset gate spacers 906. The offset spacers 906 can be formed using a spacer pull down formation process. The offset spacers 906 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

Referring still to FIG. 9, the dummy gates 902, the hard masks 904, and the offset spacers 906 have been used as masks to form fin-shaped columns 130A from the intermediate elongated stacks 130 (shown in FIGS. 4-8). Accordingly, the fin-shaped column 130A is also formed from a stack of nanosheets. The offset gate spacers 906 are formed along sidewalls of the dummy gates 902, and then an etch or a recess is applied to the intermediate elongated stacks 130 (shown in FIGS. 4-8) to form the final fin-shaped columns of stacked nanosheets 130A by etching or recessing the portions of the intermediate elongated stacks 130 that are not covered by the dummy gates 902 and the offset spacers 906. Similarly, subsequent to formation of the offset gate spacers 906, known semiconductor fabrication operations have been used to etch the portions of the semiconductor fins 402 that are not under the dummy gates 902 and the offset spacers 906.

Referring still to FIG. 9, known semiconductor fabrication processes have been used to partially remove end regions of the sacrificial nanosheets 112, 114, 116, thereby cavities (not shown) in the end regions of the sacrificial nanosheets 112, 114, 116. In embodiments of the invention, the end regions of the sacrificial nanosheets 112, 114, 116 can be removed using a first application of a so-called "pull-back" process to pull end regions of the sacrificial nanosheet regions 112, 114, 116 back an initial pull-back distance such that the end regions terminate underneath the offset gate spacers 906 In embodiments of the invention, the pull-back process includes a hydrogen chloride (HCL) gas isotropic etch process, which etches SiGe of the sacrificial nanosheets 112, 114, 116 without attacking Si of the non-sacrificial nanosheets 122, 124, 126.

Referring still to FIG. 9, known semiconductor device fabrication processes have been used to form SG inner spacers 908. In embodiments of the invention, the SG inner spacers 908 can be formed conformally by CVD, or by monolayer doping (MLD) of nitride followed by spacer RIE. The SG inner spacers 908 can be deposited using, e.g., a conformal deposition process and subsequent isotropic or anisotropic etch back to remove excess spacer material on vertical sidewalls of the fin-shaped column of stacked nanosheets 130A and on the surface of the IC 100. The inner spacer material can be formed from silicon nitride, silico-boron carbonitride, silicon carbonitride, silicon carbon oxynitride, or any other type of dielectric material (e.g., a dielectric material having a dielectric constant k of less than about 5).

Referring still to FIG. 9, known semiconductor device fabrication processes have been used to form raised source/drain (S/D) regions 802, 804, 806, 808. In embodiments of the invention, the raised S/D regions 912, 914, 922, 924 are formed using an epitaxial layer growth process on the exposed ends of the non-sacrificial nanosheets 122, 124, 126 in the SG region 140, as well as on exposed ends of the post-etch fins 402 as shown in FIG. 9. In embodiments of the invention, the raised S/D regions 912, 914, 922, 924 are formed using an epitaxial layer growth processes. In-situ doping (ISD) is applied to form doped S/D regions 912, 914, 922, 924, thereby creating the necessary junctions for the SG transistors in the SG region 140 and the EG transistors in the EG region 150. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

Referring still to FIG. 9, known semiconductor fabrication operations have been used to form the ILD region 910. The ILD region 910 can be formed by depositing an oxide material in bulk (e.g., silicon dioxide) and polishing the bulk oxide back (e.g., using CMP) to the level of the offset gate spacers 906 and the hard masks 904.

Figure 10:
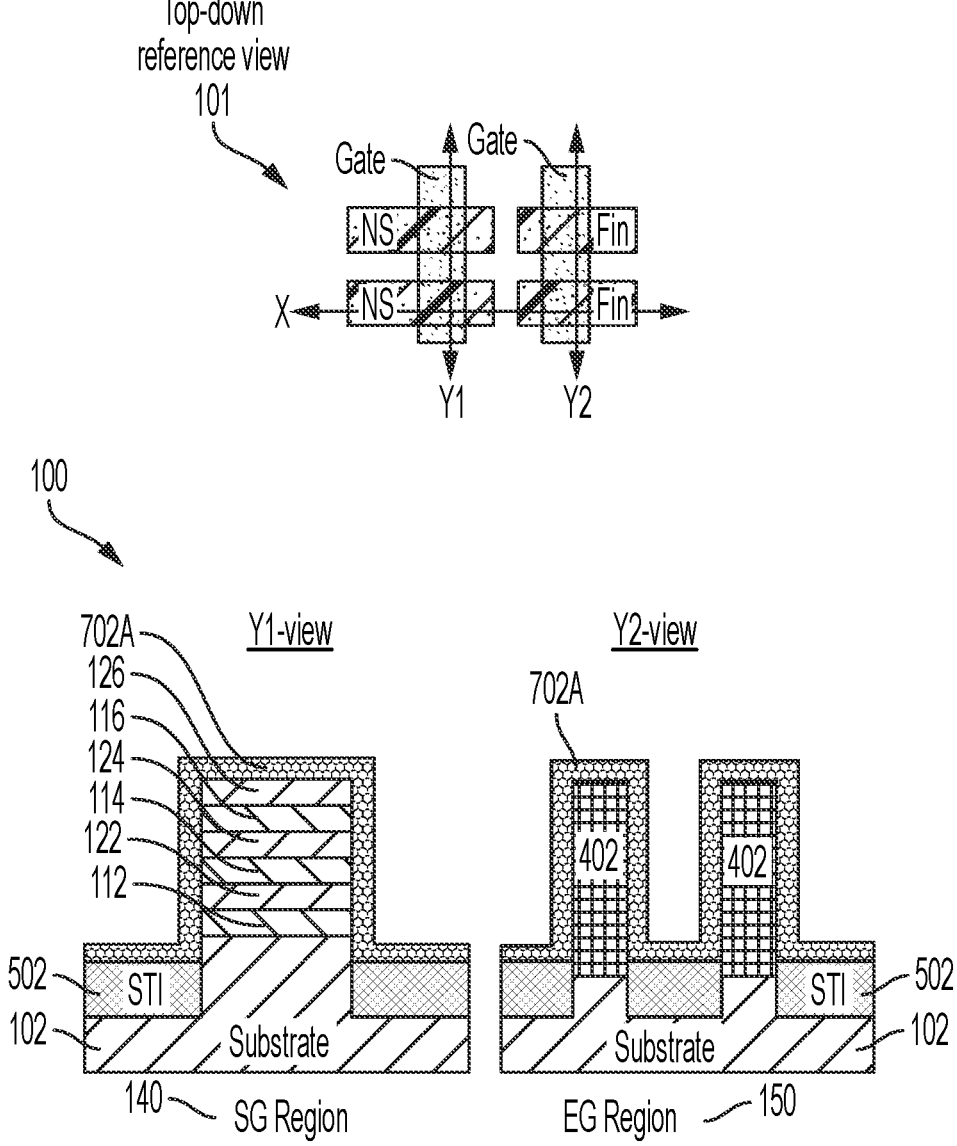
Figure 10:
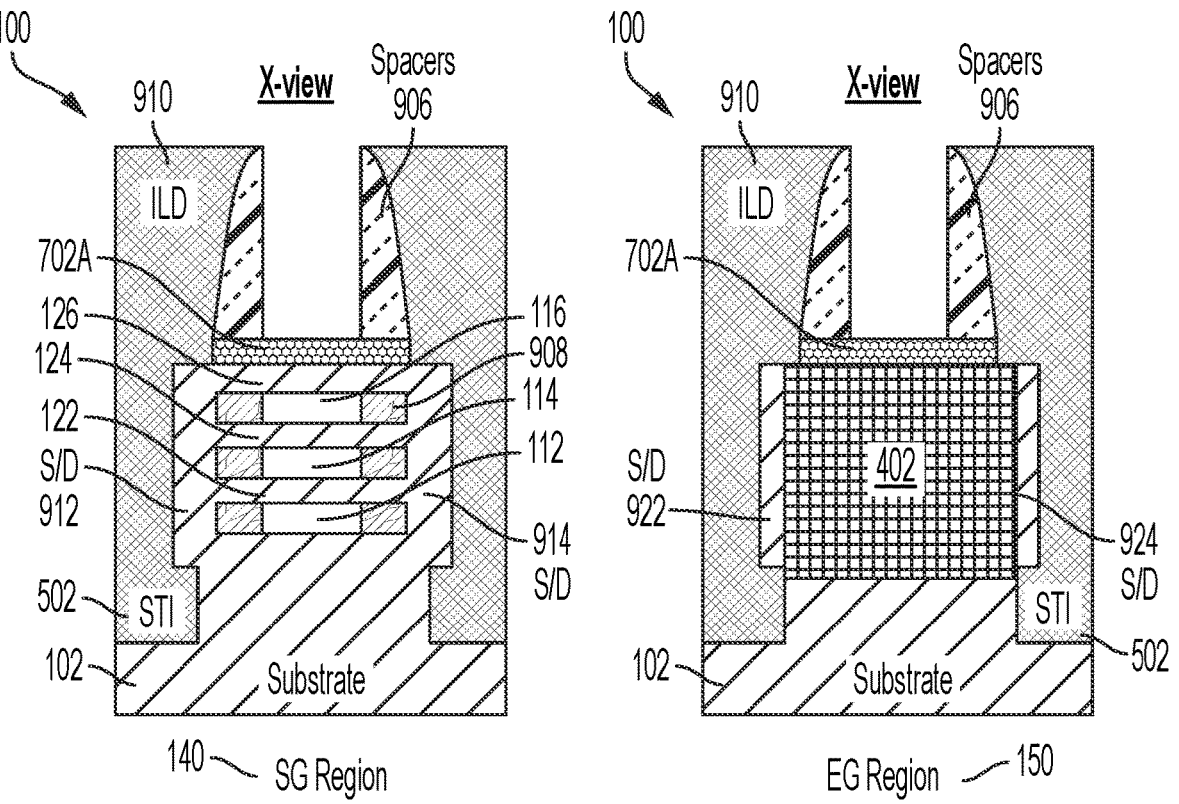

In FIG. 10, known semiconductor fabrication operations have been used to remove the dummy gates 902 and the hard masks 904. The dummy gates 902 and the hard mask 904 can be removed by a known etching process, e.g., RIE or chemical oxide removal (COR).

Figure 11:
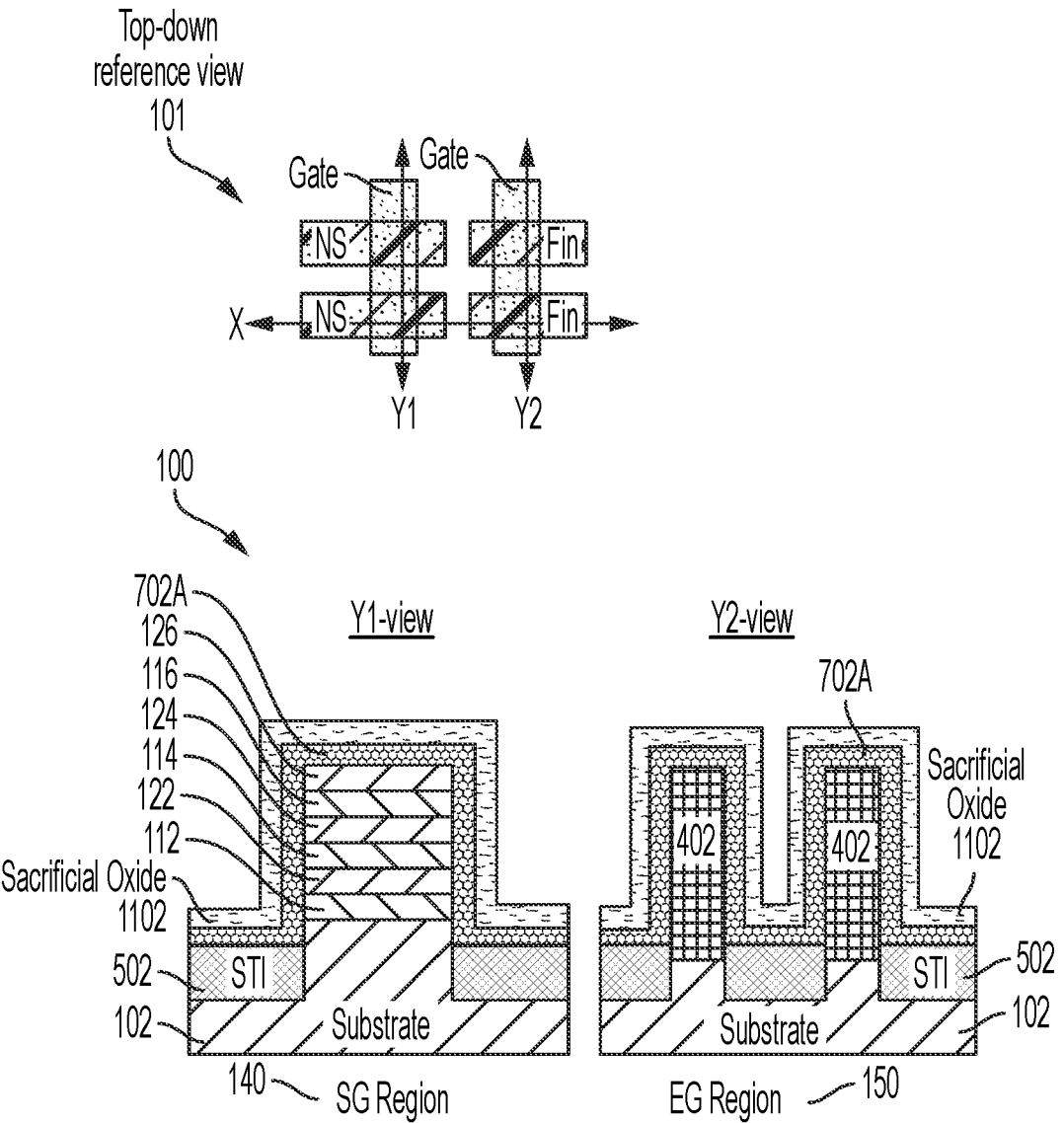
Figure 11:
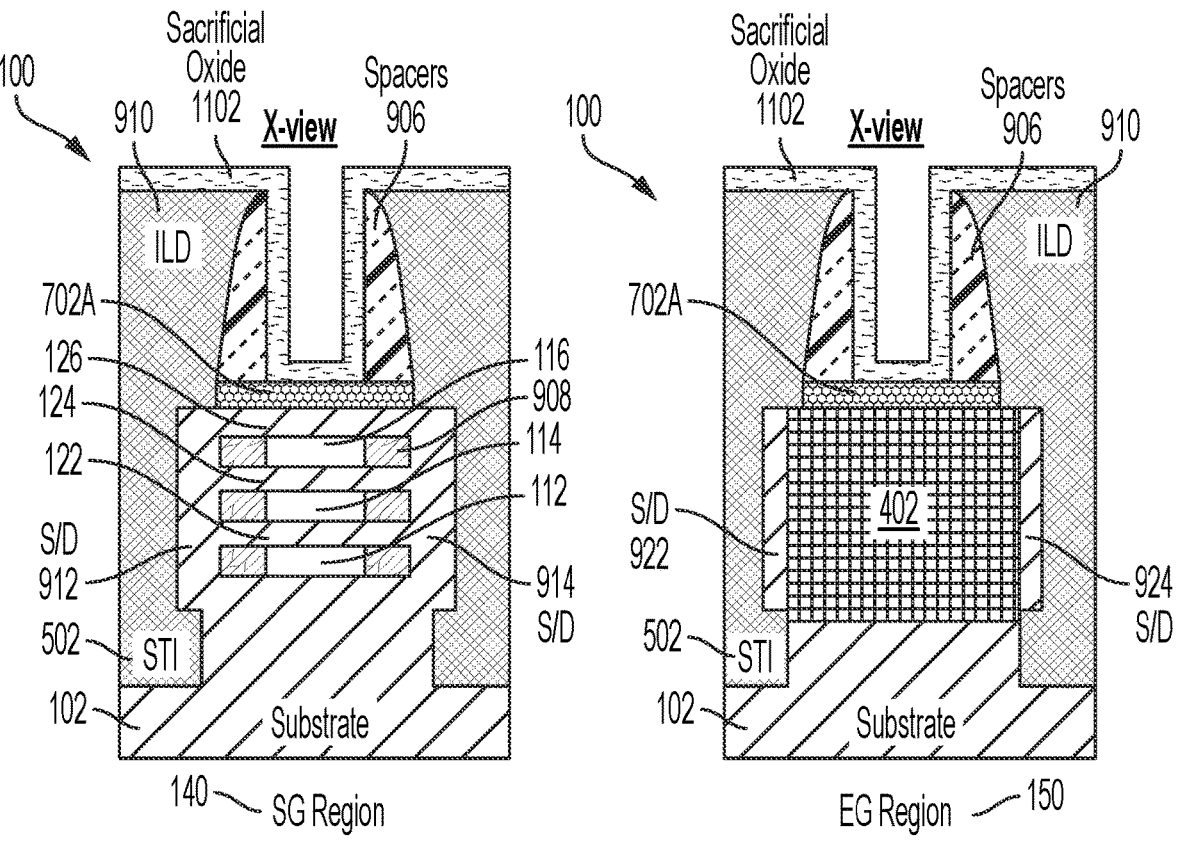

In FIG. 11, known semiconductor fabrication operations have been used to deposit a protective sacrificial oxide layer 1102 over the IC 100. The protective sacrificial oxide 1102 can be formed from one or more dielectric materials suitable for forming an oxide. The protective sacrificial oxide 1102 can be formed by suitable deposition processes, for example, CVD, PECVD, atomic layer deposition (ALD), evaporation, physical vapor deposition (PVD), chemical solution deposition, or other like processes. In some embodiments of the invention, the protective sacrificial oxide 1102 is also deposited at low-temperatures (e.g., less than about 400 degrees Celsius). The protective sacrificial layer 1102 protects the reinforced EG oxide 702A from damage that can result from the various patterning processes (e.g., processes such as ashing, wet strip, and the like used to strip resist or OPL) used in forming the EG FinFETs 1620A, 1620B (shown in FIGS. 16 and 18).

Figure 12:
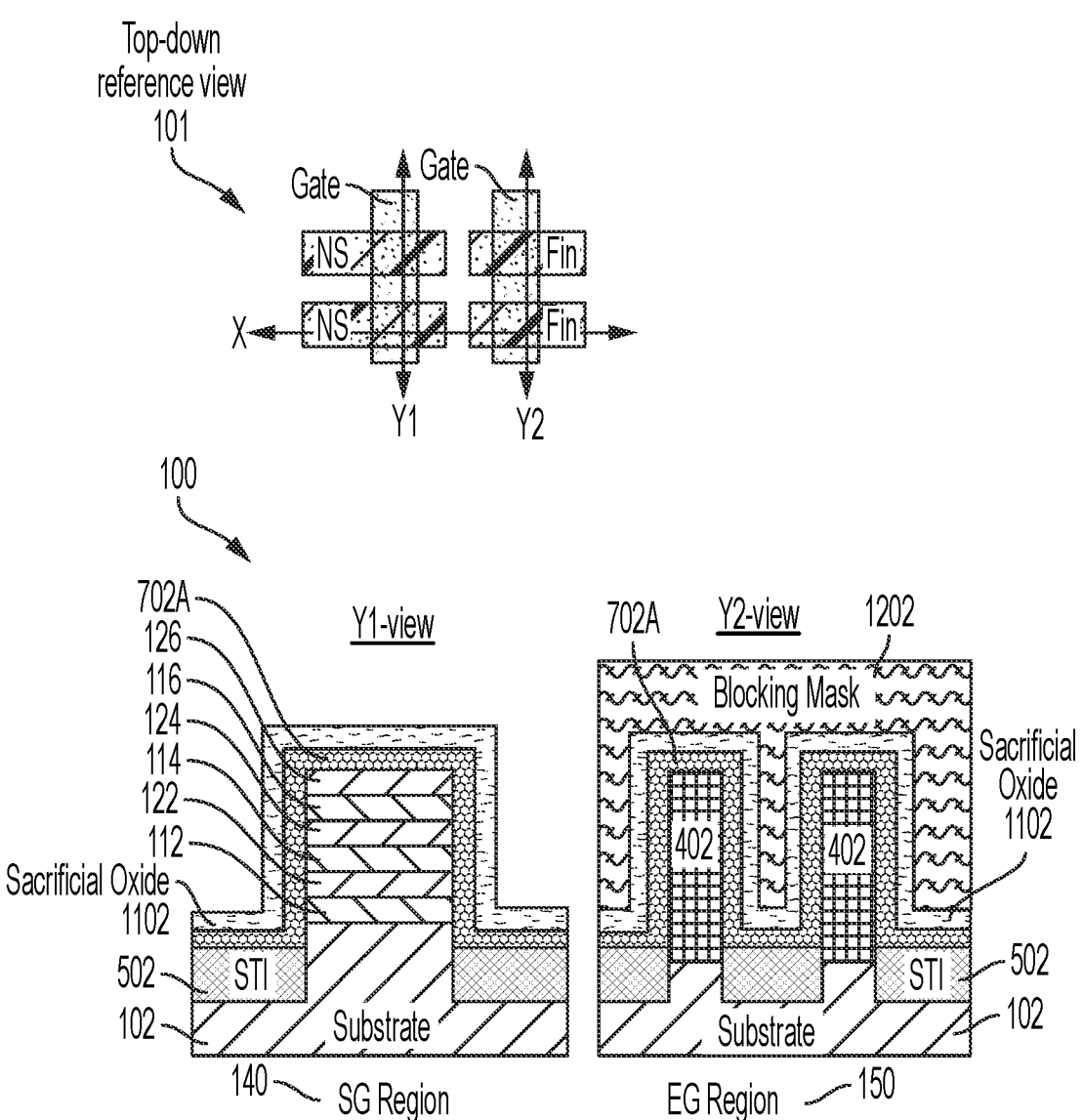
Figure 12:
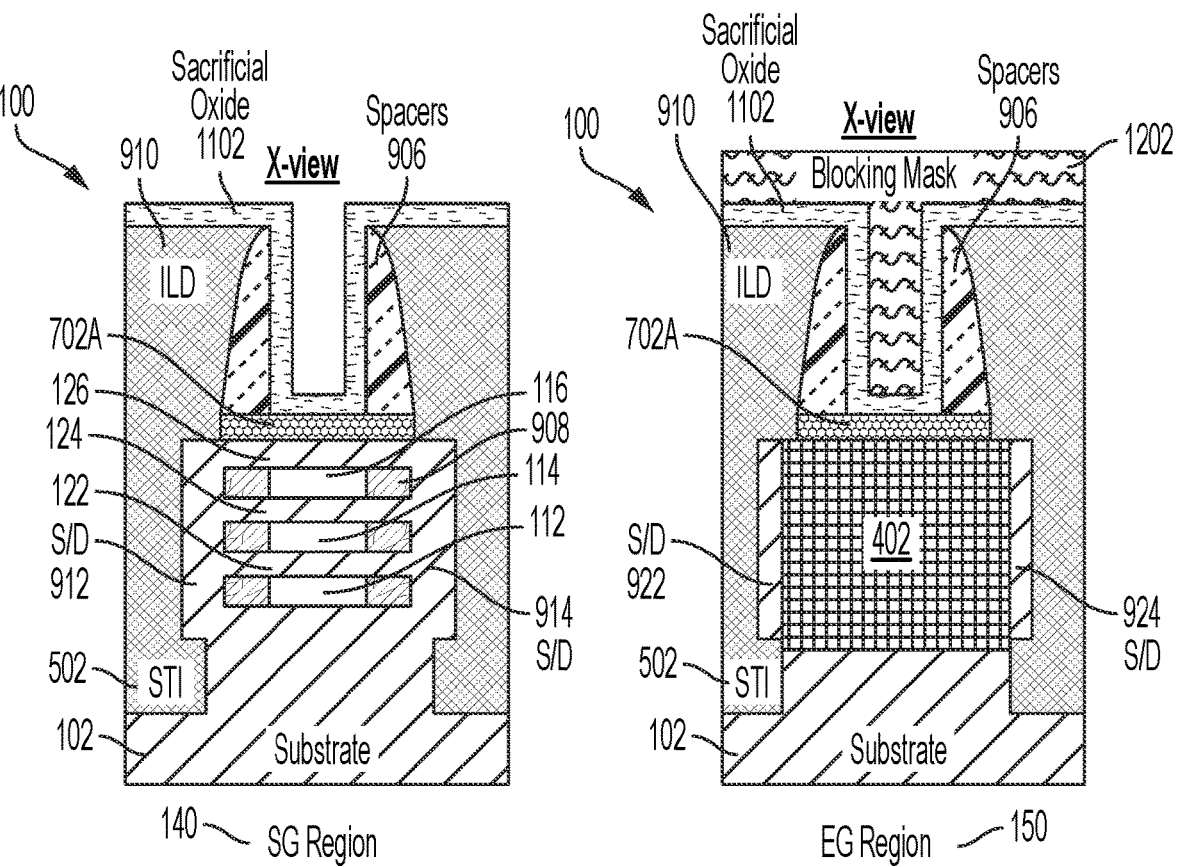

In FIG. 12, known semiconductor fabrication operations have been used to cover the EG region 150 of the substrate 102 with a blocking mask 1202. In embodiments of the invention, the blocking mask 1202 can be deposited on the EG region 150 of the substrate 102 and recessed to a predetermined level as shown. In accordance with aspects of the invention, the blocking mask 1202 protects the EG transistors in the EG region 150 from being impacted by downstream processing operations. In embodiments of the invention, the blocking mask 1202 can be formed from any suitable material, including, for example, spin-on carbon (SOC) and/or organic planarization layers (OPL). In general, OPLs are used as etch masks for pattern transfers into inorganic substrates, to fill pre-existing features, and to planarize a substrate to allow for larger patterning process windows. While both SOC and OPL materials are generally suitable for the blocking mask 1202, SOC is better suited to withstand a higher downstream thermal budget.

Figure 13:
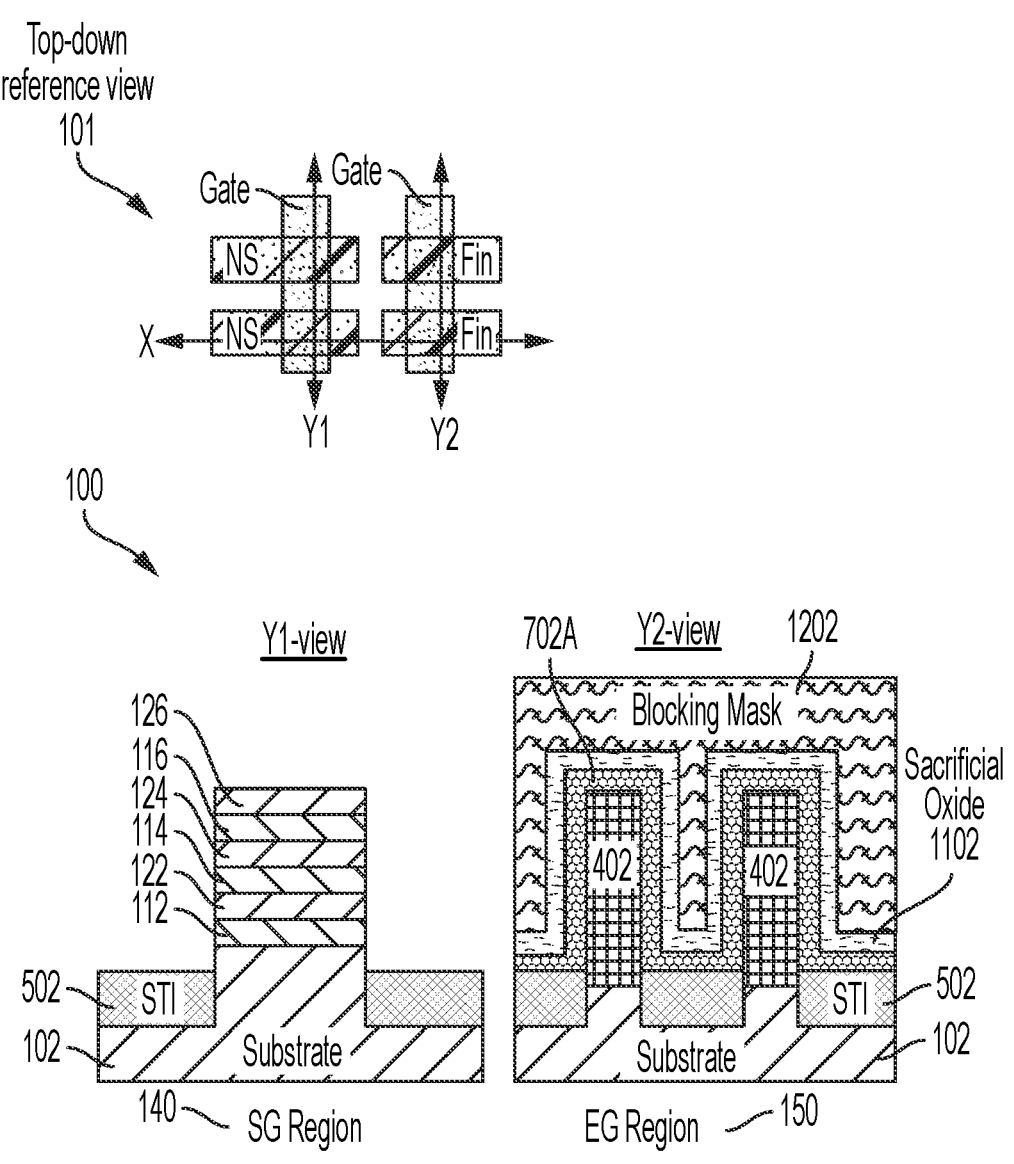
Figure 13:
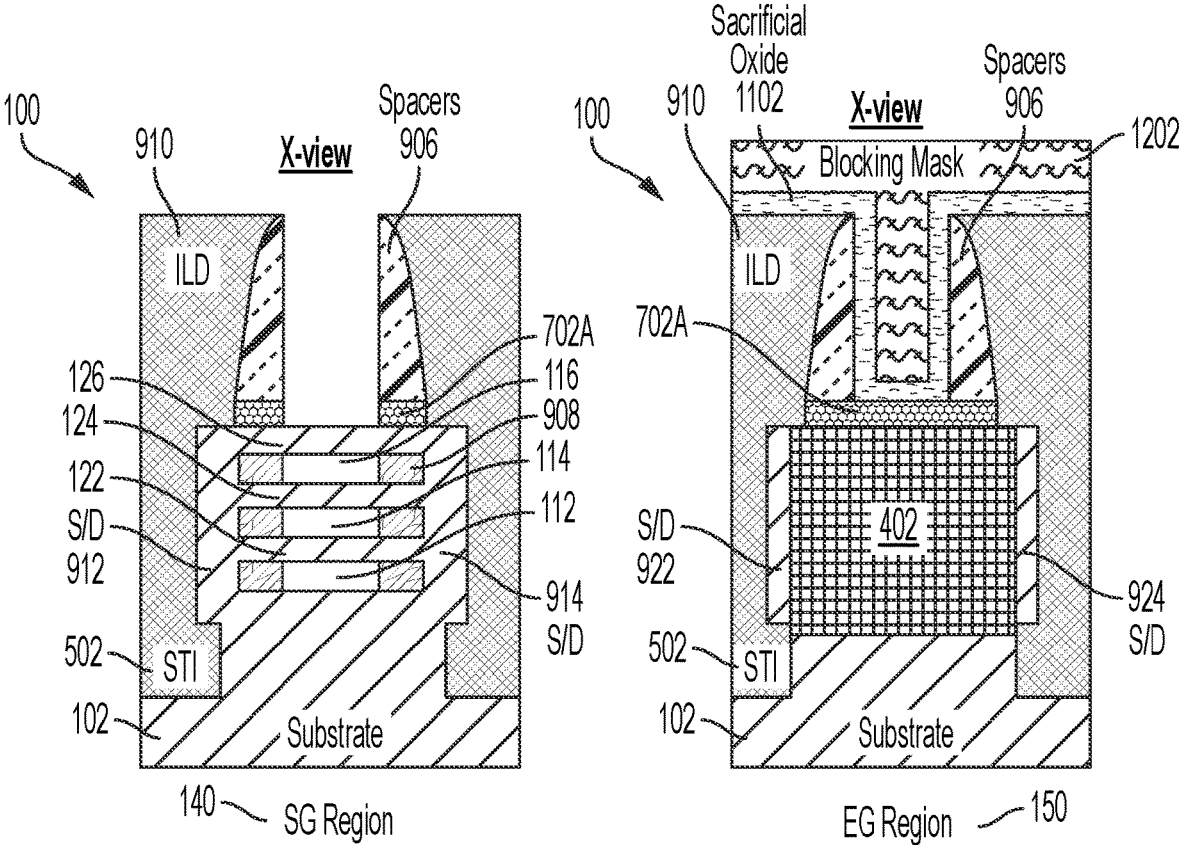

In FIG. 13, known semiconductor fabrication operations have been used to remove the protective sacrificial oxide 1102 and the reinforced EG oxide 702A from the SG region 140 of the substrate 102. In embodiments of the invention, the protective sacrificial oxide 1102 can be removed by applying a suitable oxide selective etch. In embodiments of the invention, the reinforced EG oxide 702A can be removed from the SG region 140 by applying a suitable etch that is selective to the composition of the reinforced EG oxide 702A, and the composition of the reinforced EG oxide 70A depends on the low-temperature reinforcement treatment 802 that was used to form reinforced EG oxide 702A. After application of the selective etch to remove the reinforced EG oxide 702A, a small portion of the reinforced EG oxide 702A remains under the gate spacers 906 in the SG region 140.

Figure 14:
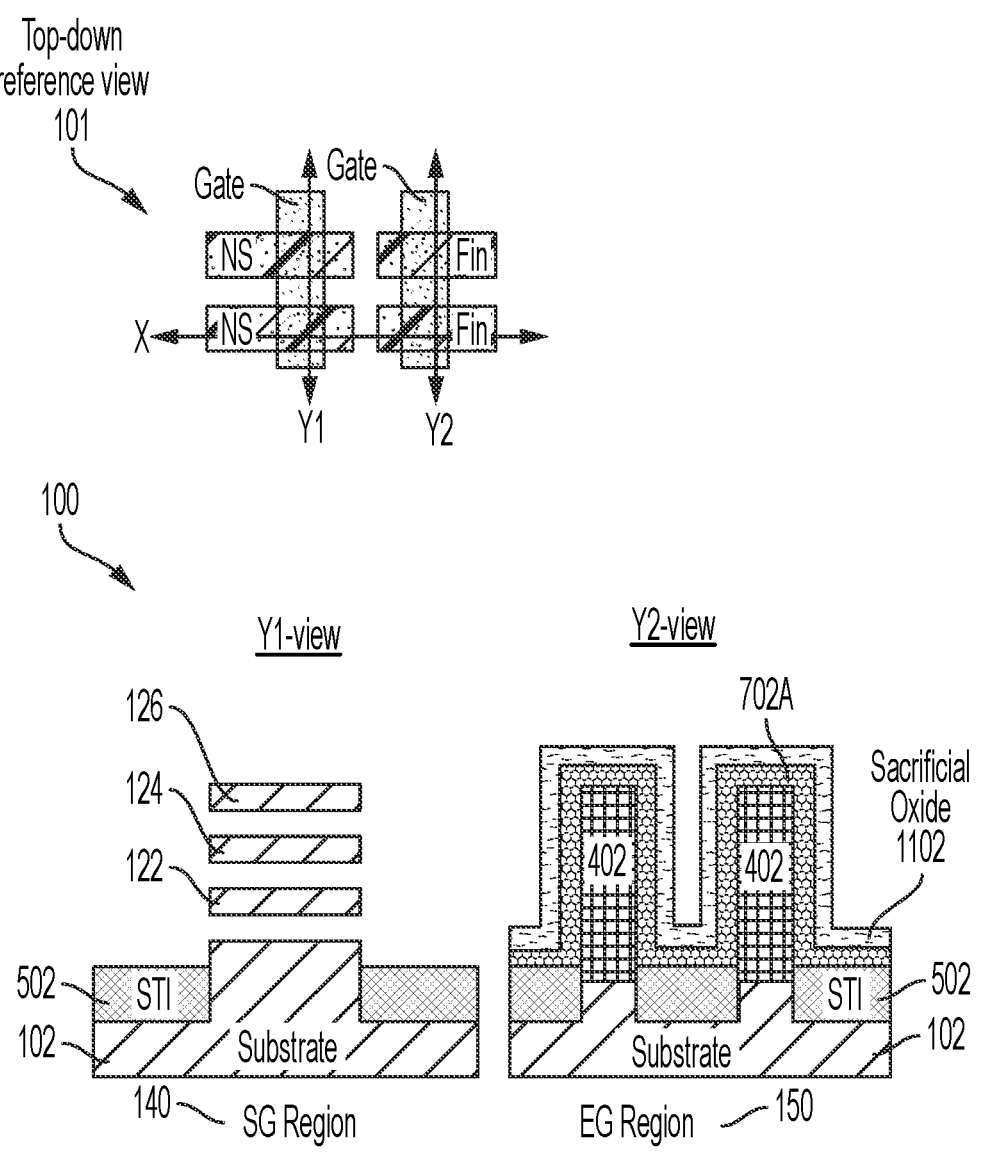
Figure 14:
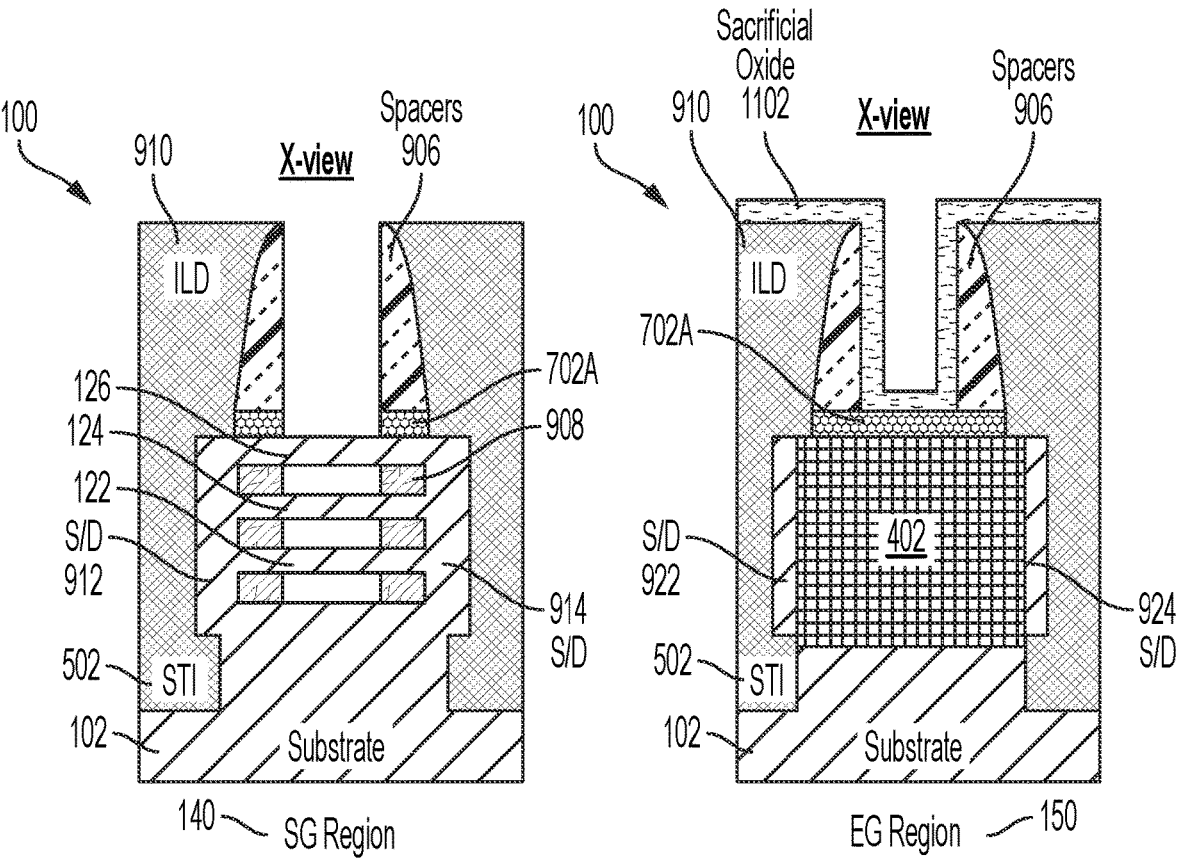

In FIG. 14, known fabrication operations have been used to remove the sacrificial nanosheets 112, 114, 116 selective to the non-sacrificial nanosheets 122, 124, 126. In embodiments of the invention, because the sacrificial nanosheets 112, 114, 116 are formed from SiGe, they can be selectively etched with respect to the Si non-sacrificial nanosheets 122, 124, 126 using, for example, a vapor phase hydrogen chloride (HCL) gas isotropic etch process.

Referring still to FIG. 14, subsequent to removing the sacrificial nanosheets 112, 114, 116, known semiconductor fabrication operations have been used to remove the blocking mask 1202 from the EG region 150 of the substrate 102.

FIGS. 15 and 16 depict an example of how the fabrication operations depicted in FIGS. 1-14 can be completed without the protective sacrificial oxide 1102 in the EG region 150. In FIG. 15, known semiconductor fabrication operations have been used to deposit a high-quality (HQ) relatively thin gate oxide 1502 in the SG region 140 and the EG region 150. In FIG. 16, known semiconductor fabrication operations have been used to form metal gates 1602 in the spaces that were occupied by the dummy gates 902 and the sacrificial nanosheets 112, 114, 116, thereby forming an SG nanosheet FET 1610 in the SG region 140 and forming in-series EG FinFETs 1620A in the EG region 150.

Together, the HQ thin gate oxide 1502 and the metal gate 1602 are referred to herein as a high-k metal gate (HKMG) 1502/1602. The HKMG 1502/1602 regulates electron flow through the non-sacrificial nanosheets (or nanosheet channels) 122, 124, 126 in the SG region 140, as well as through the fins 402 in the EG region 150. The metal gate 1602 can include metal liners and work-function metals (WFM). In embodiments of the invention, the WFM can be, for example, TiN or TaN, and the metal gate structure can be aluminum or tungsten. The HQ thin gate oxide 1502 can include interfacial layers (IL) and high-k dielectric layers. In some embodiments of the invention, the high-k dielectric layers can modify the work function of the WFM. The high-k dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

As depicted in FIG. 16, after the fabrication operations depicted in FIGS. 15 and 16, an SG nanosheet FET 1610 is formed in the SG region 140, and two (2) in-series EG FinFETs 1620A are formed in the EG region 150. The SG nanosheet FET 1610 is characterized by having a relatively thin (e.g., from about 0.5 nm to about 1 nm) gate oxide 1502 formed from a HQ IL and high-k dielectric. Each EG FinFET 1620A is characterized by having a relatively thick (e.g., from about 2 nm to about 5 nm) gate oxide formed from the gate oxide 1502 and the reinforced EG oxide 702A. Accordingly, the relatively thick EG gate oxide 1502/702A enables each EG FinFET 1602A to be used to implement applications (e.g., input/output (I/O) circuitry) that require transistors configured to tolerate a $V_T$ that is higher than SG $V_T$ levels.

FIGS. 17 and 18 depict an example of how the fabrication operations depicted in FIGS. 1-14 can be completed without removing the protective sacrificial oxide 1102 from the EG region 150. FIG. 17 is identical to FIG. 15, except the protective sacrificial oxide 1102 has not been removed from the EG region 150. FIG. 18 is identical to FIG. 16, except the protective sacrificial oxide 1102 has not been removed from the EG region 150. As depicted in FIG. 18, after the fabrication operations depicted in FIGS. 17 and 18, the SG nanosheet FET 1610 is formed in the SG region 140, and two (2) in-series EG FinFETs 1620B are formed in the EG region 150. The SG nanosheet FET 1610 is characterized by having a relatively thin (e.g., from about 0.5 nm to about 1 nm) gate oxide 1502 formed from a HQ IL and high-k dielectric. Each EG FinFET 1620B is characterized by having a relatively thick (e.g., from about 3.5 nm to about 9 nm) gate oxide formed from the gate oxide 1502, the reinforced EG oxide 702A, and the protective sacrificial oxide 1102. Accordingly, the relatively thick EG gate oxide 1502/1102/702A enables each EG FinFET 1602B to be used to implement applications (e.g., input/output (I/O) circuitry) that require transistors configured to tolerate a $V_T$ that is higher than SG $V_T$ levels.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of +8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:
1. A method of fabricating an integrated circuit (IC), the method comprising:
performing fabrication operations to form an extended-gate field effect transistor (EG-FET) and a standard gate FET (SG-FET) on a substrate, wherein the EG-FET provides a maximum extended gate (EG) threshold voltage, wherein the SG-FET provides a maximum standard gate (SG) threshold voltage that is less than the maximum EG threshold voltage, and wherein the fabrication operations include:
forming a channel in an EG region of the substrate;
depositing a first EG gate dielectric over the channel at a first low-temperature;

wherein the first EG gate dielectric comprises a first quality level, the first quality level being defined by a measurable property of the EG gate dielectric that is correlated with an ability of the EG-FET to provide the maximum EG threshold voltage; and applying a reinforcement treatment to the first EG gate dielectric at a second low-temperature, wherein the reinforcement treatment converts the first EG gate dielectric to a reinforced first EG gate dielectric comprising a second quality level, the second quality level being defined by the measurable property and being correlated with an increased ability of the EG-FET to provide the maximum EG threshold voltage relative to the first quality level;

wherein the second quality level is greater than the first quality level.

2. The method of claim 1, wherein:

the first low-temperature is at or below about 400 degrees Celsius; and the second low-temperatures is at or below about 800 degrees Celsius.

3. The method of claim 1, wherein:

the reinforcement treatment comprises a nitridation treatment; and the reinforced first EG gate dielectric comprises a nitride.

4. The method of claim 1, wherein the fabrication operations further include:

selecting the first low-temperature to be below the second low-temperature; and selecting the second low-temperature to be below a third low-temperature that causes a diffusion of a first type of semiconductor material across an interface and into a second type of semiconductor to exceed a predetermined minimum diffusion level.

5. The method of claim 1, wherein:

the reinforcement treatment comprises a plasma densification; and the reinforced first EG gate dielectric includes reinforcement elements selected from the list consisting of argon, helium, and hydrogen.

6. The method of claim 1, wherein the fabrication operations further comprise:

depositing an SG gate dielectric over the reinforced first EG gate dielectric;

wherein the reinforced first EG gate dielectric comprises a first thickness;

wherein the SG gate dielectric comprises a second thickness; and wherein the second thickness is less than the first thickness.

7. The method of claim 6, wherein the SG gate dielectric comprises a high-k dielectric layer.

8. The method of claim 7, wherein the SG gate dielectric further comprises an interfacial layer.

9. The method of claim 6 further comprising depositing a second EG gate dielectric between the reinforced first EG gate dielectric and the SG gate dielectric, wherein the second EG gate dielectric comprise a third thickness.

10. The method of claim 9, wherein the second thickness is less than the third thickness.

11. The method of claim 1, wherein the EG-FET comprises a fin-type FET.

12. A method of fabricating an integrated circuit (IC), the method comprising:

performing fabrication operations to form an extended-gate field effect transistor (EG-FET) and a standard-gate field effect transistor (SG-FET) on a substrate, wherein the EG-FET provides a maximum extended gate (EG) threshold voltage, wherein the SG-FET provides a maximum standard gate (SG) threshold voltage that is less than the maximum EG threshold voltage, and wherein the fabrication operations include:

forming a stack in an SG region of the substrate, wherein the stack comprises a layer of a first type of semiconductor material, a layer of a second type of semiconductor material, and an interface between the layer of the first type of semiconductor material and the layer of the second type of semiconductor material;

depositing an SG gate dielectric over the stack;

forming a channel in an EG region of the substrate;

depositing a first EG gate dielectric over the channel at a first low-temperature;

wherein the first EG gate dielectric comprises a first quality level, the first quality level being defined by a measurable property of the EG gate dielectric that is correlated with an ability of the EG-FET to provide the maximum EG threshold voltage;

applying a reinforcement treatment to the first EG gate dielectric at a second low-temperature, wherein the reinforcement treatment converts the first EG gate dielectric to a reinforced first EG gate dielectric comprising a second quality level, the second quality level being defined by the measurable property and being correlated with an increased ability of the EG-FET to provide the maximum EG threshold voltage relative to the first quality level;

wherein the second quality level is greater than the first quality level.

13. The method of claim 12, wherein:

the EG-FET comprises a fin-type FET;

the SG-FET comprises a nanosheet FET;

the first low-temperature is at or below about 400 degrees Celsius; and the second low-temperatures is at or below about 800 degrees Celsius.

14. The method of claim 12, wherein:

the reinforcement treatment comprises a nitridation treatment; and the reinforced first EG gate dielectric comprises a nitride.

15. The method of claim 12, wherein:

the reinforcement treatment comprises a plasma densification; and the reinforced first EG gate dielectric includes reinforcement elements selected from the list consisting of argon, helium, and hydrogen.

16. The method of claim 12 further comprising:

depositing the SG dielectric over the reinforced first EG gate dielectric;

wherein a thickness of the SG dielectric is less than a thickness of the reinforced first EG gate dielectric;

depositing a second EG gate dielectric between the reinforced first EG gate dielectric and the SG gate dielectric;

wherein the second EG gate dielectric comprise a second EG gate dielectric thickness; and wherein the thickness of the SG gate dielectric is less than a thickness of the second EG gate dielectric.

17. The method of claim 12, wherein:

the fabrication operations further include:

selecting the first low-temperature to be below the second low-temperature;

selecting the second low-temperature to be below a third low-temperature that causes a diffusion of the first type of semiconductor material across the inter-
face and into the second type of semiconductor to
exceed a predetermined minimum diffusion level;

the EG-FET comprises a fin-type FET; and the SG-FET comprises a nanosheet FET.

*   *   *   *   *